(12) United States Patent
Ono

(10) Patent No.: US 6,727,023 B2
(45) Date of Patent: Apr. 27, 2004

(54) ELECTROLYTE COMPOSITION, ELECTROCHEMICAL CELL AND IONIC LIQUID CRYSTAL MONOMER

(75) Inventor: Michio Ono, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 151 days.

(21) Appl. No.: 09/759,363

(22) Filed: Jan. 16, 2001

(65) Prior Publication Data

US 2002/0034690 A1 Mar. 21, 2002

(30) Foreign Application Priority Data

Jan. 17, 2000 (JP) .................... P. 2000-008054

(51) Int. Cl.$^7$ ................................ H01M 6/18
(52) U.S. Cl. ................ 429/306; 429/317; 429/314; 429/316; 429/307; 429/328; 252/62.2; 252/299.61
(58) Field of Search ............... 429/306, 317, 429/314, 316, 307, 328; 252/299.61, 62.2

(56) References Cited

U.S. PATENT DOCUMENTS 4,927,721 A    5/1990    Gratzel et al. ............. 429/111

6,495,067 B1 * 12/2002 Ono ................. 252/299.61

FOREIGN PATENT DOCUMENTS

JP    10-83821    *  3/1998
WO   95/18456        7/1995

OTHER PUBLICATIONS

Yoshizawa et al. "Molecular Brush Having Molten Salt Domain for Fast Ion Conduction", Chemistry Letters (May 1999), pp. 889–890.*

Regan, B. et al., "A low–cost, high–efficiency solar cell based on dye–sensitized colloidal $TiO_2$ films", Nature, vol. 353, pp. 737–740, Oct. 24, 1991.

* cited by examiner

Primary Examiner—Laura Weiner
(74) Attorney, Agent, or Firm—Sughrue Mion, PLLC

(57) ABSTRACT

An electrolyte composition comprising a polymer compound formed by polymerizing an ionic liquid crystal monomer containing at least one polymerizable group. Also disclosed are an electrochemical cell, a nonaqueous secondary cell and a photoelectrochemical cell, each comprising the electrolyte composition.

16 Claims, 1 Drawing Sheet

ELECTROLYTE COMPOSITION, ELECTROCHEMICAL CELL AND IONIC LIQUID CRYSTAL MONOMER

FIELD OF THE INVENTION

The present invention relates to an electrolyte composition for electrochemical cell and more particularly to an electrolyte composition for use in nonaqueous secondary electrolyte cell and photoelectrochemical cell. The present invention further relates to an electrochemical cell and photoelectrochemical cell comprising such an electrolyte composition. The present invention still further relates to a novel liquid crystal compound.

BACKGROUND OF THE INVENTION

The electrolyte to be used in an electrochemical cell such as nonaqueous secondary electrolyte cell and dye-sensitized solar cell is a medium containing ions depending on the purpose capable of transporting the ions between electrodes (ionic conductivity) For example, the performance of a secondary lithium cell representing the nonaqueous secondary cell is governed by the transportation of lithium ion. The performance of dye-sensitized solar cell is governed by the conductivity of iodine ion and iodine trimer ion. These cells normally often comprise a solution system having a high ionic conductivity as an electrolyte but is disadvantageous in that the exhaustion or leakage of the solvent used causes deterioration of durability of the cells in which the electrolyte is incorporated. In the case of secondary lithium cell, a metallic vessel must be used to seal the solution. This adds to the weight of the cell and makes it difficult to have a desired degree of freedom of the shape of cell. In order to overcome these difficulties with such a solution-based electrolyte, various electrolytes have been recently proposed. A so-called gel electrolyte obtained by wetting a polymer matrix with an solution electrolyte exhibits a less drop of ionic conductivity and hence causes a less deterioration of cell properties than the solution-based electrolyte but cannot completely be prevented from the volatilization of the solvent. A polymer electrolyte obtained by dissolving a salt in a polymer such as polyethylene oxide is expected to give solution to the problems with the solution-based electrolyte but leaves something to be desired in ionic conductivity. On the other hand, an imidazolium salt or pyridinium salt the counter anion of which is $BF_4^-$, $(CF_3SO_2)_2N^-$ or the like is a room temperature molten salt which stays liquid at room temperature and has been proposed to be an electrolyte for lithium ion cell. However, such an electrolyte shows a mechanical strength and an ionic conductivity which vary in opposite manner. Thus, when the mechanical strength of the electrolyte is raised by increasing the viscosity of the molten salt itself or incorporating a polymer in the molten salt, there shows a drop of ionic conductivity of the electrolyte. Further, such an electrolyte has a great dependence of ionic conductivity on temperature and thus shows an insufficient ionic conductivity particularly at low temperatures.

By the way, photovoltaic power generation in which light energy is converted to electric energy has been practically realized or studied in the form of single crystal silicon solar cell, polycrystalline silicon solar cell, amorphous silicon solar cell and compound type solar cell comprising cadmium telluride or indium selenide. In order to find wide application of these solar cells, it is necessary to overcome problems involving the production cost, availability of raw materials and length of energy payback time. On the other hand, many proposals have heretofore been made for solar cell comprising an organic material aiming at the increase of working surface area or reduction of cost. However, these proposals are disadvantageous in that they exhibit a low conversion efficiency and a poor durability.

Under these circumstances, "Nature", vol. 353, pp. 737–740, 1991, and U.S. Pat. No. 4,927,721 disclosed techniques concerning a photoelectric element comprising an oxide semiconductor sensitized with a dye (hereinafter simply referred to as "dye-sensitized photoelectric element") and a photoelectrochemical cell comprising such a dye-sensitized photoelectric element. This cell comprises a photoelectric element which acts as a negative electrode, a charge-transferring layer and a counter electrode. The photoelectric element comprises an electrically-conductive support and a photosensitive layer. The photosensitive layer comprises a semiconductor having a dye adsorbed to the surface thereof. The charge-transferring layer comprises a redox material which acts to transport charge between the negative electrode and the counter electrode (positive electrode). The photoelectrochemical cell proposed in the above cited patent comprises as a charge-transferring layer an aqueous solution of a salt such as potassium iodide as an electrolyte (electrolytic solution). This system is advantageous in that it is realized at a low cost and can attain a relatively high energy conversion efficiency (photoelectric conversion efficiency) but is disadvantageous in that when used over an extended period of time, the evaporation or exhaustion of the electrolytic solution causes a remarkable deterioration of photoelectric conversion efficiency or makes it impossible for the cell to operate properly.

Referring to these problems, as a countermeasure against the exhaustion of electrolytic solution there is disclosed a method involving the use of an imidazolium salt, which is a low melting compound, as an electrolyte in WO95/18456. The employment of this method eliminates or lessens the necessity of water or an organic solvent, which has heretofore been used as a solvent for electrolyte, making it possible to improve the durability of the electrolyte. However, this electrolyte leaves something to be desired in durability. This method is also disadvantageous in that when the concentration of the imidazolium salt increases, the resulting photoelectric conversion efficiency is deteriorated. Another method has been proposed involving the use of a triazolium salt as an electrolyte. However, this method has the same problems as imidazolium salt.

SUMMARY OF THE INVENTION

An object of the invention is to provide an electrolyte composition for an electrochemical cell having excellent durability and ionic conductivity and a photochemical cell having excellent durability and photoelectric properties. Another object of the invention is to provide a liquid crystal composition comprising a novel liquid crystal compound to be incorporated in the foregoing electrolyte composition.

Other objects and effects of the present invention will become more apparent from the following description.

The foregoing objects of the invention have been achieved by providing the following electrolyte compositions, electrochemical cell, nonaqueous secondary cell, photoelectrochemical cell, ionic liquid crystal monomer, and polymer.

(1) An electrolyte composition comprising a polymer compound formed by polymerizing an ionic liquid crystal monomer containing at least one polymerizable group.

(2) The electrolyte composition according to the above item (1), wherein the ionic liquid crystal monomer has an organic cation-containing mesogen group and an ethyleneoxy group.

(3) The electrolyte composition according to the above item (1) or (2), wherein the ionic liquid crystal monomer is represented by the following general formula (I):

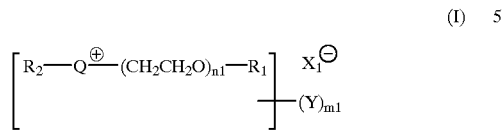

(I)

wherein Q represents an organic atomic group which can form a cation; $R_1$ represents an alkyl or alkenyl group; $R_2$ represents substituent which imparts liquid crystallinity; $X_1^-$ represents an anion; Y represents a polymerizable group which substitutes on $R_1$, $R_2$ or Q; $n_1$ represents an integer of from 1 to 25; $m_1$ represents an integer of from 1 to 4, with the proviso that when m1 is 2 or more, the plurality of Y's may be the same or different and that the compound of the general formula (I) may be connected to each other at $R_1$ or $R_2$ to form a dimer, trimer or tetramer.

(4) The electrolyte composition according to any one of the above items (1) to (3), wherein the polymerizable group is an ethylenically unsaturated group.

(5) The electrolyte composition according to any one of the above items (1) to (4), wherein the polymerizable group comprises a group selected from the group consisting of acryloyl group, methacryloyl group and styryl group.

(6) The electrolyte composition according to any one of the above items (3) to (5), wherein $R_2$ in the general formula is represented by the following general formula (II):

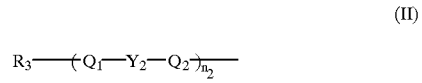

(II)

wherein $R_3$ represents an alkyl or alkenyl group; $Y_2$ represents a divalent 4-, 5-, 6- or 7-membered ring substituent or a condensed ring substituent formed thereby; $Q_1$ and $Q_2$ each represent a divalent substituent or a single bond; and $n_2$ represents an integer of from 1 to 3, with the proviso that when $n_2$ is 2 or 3, the plurality of $Y_2$'s, $Q_1$'s and $Q_2$'s may be the same or different, respectively.

(7) The electrolyte composition according to any one of the above items (3) to (6), wherein Y in the general formula (I) is represented by the following general formula (III):

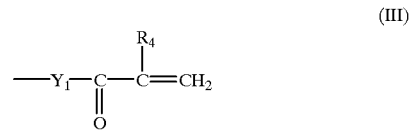

(III)

wherein $R_4$ represents a hydrogen atom or an alkyl group; —$Y_1$— represents —O—, —N($R_7$)— or a single bond; and $R_7$ represents a hydrogen atom or alkyl group, with the proviso that when $m_1$ in the general formula is 2 or more, $R_4$ in the plurality of Y's may be the same or different.

(8) The electrolyte composition according to any one of the above items (3) to (7), wherein Q in the general formula (I) is an organic atomic group which can form a heterocyclic cation containing a nitrogen atom or a quaternary alkylammonium cation.

(9) The electrolyte composition according to any one of the above items (3) to (8), wherein —Q— in the general formula (I) is represented by the following general formula (IV):

(IV)

wherein $R_5$ represents a substituent; and $n_3$ represents an integer of from 0 to 4, with the proviso that when $n_3$ is 2 or more, the plurality of $R_5$'s may be the same or different.

(10) The electrolyte composition according to any one of the above items (3) to (8), wherein —Q— in the general formula (I) is represented by the following general formula (V):

(V)

wherein $R_5$ represents a substituent; and $n_3$ represents an integer of from 0 to 3, with the proviso that when $n_3$ is 2 or more, the plurality of $R_5$'s may be the same or different.

(11) The electrolyte composition according to any one of the above items (3) to (10), wherein $X_1^-$ in the general formula (I) is a halogen anion, an amide anion, or a fluoride anion containing at least one element selected from the group consisting of boron (B), phosphorus (P) and sulfur (S).

(12) The electrolyte composition according to any one of the above items (3) to (11), wherein $X_1^-$ in the general formula (I) is an iodine anion.

(13) The electrolyte composition according to any one of the above items (1) to (12), further comprising a lithium salt.

(14) The electrolyte composition according to any one of the above items (1) to (13), comprising a polymer compound obtained by photopolymerizing the ionic liquid crystal monomer while being oriented.

(15) An electrochemical cell comprising an electrolyte composition according to any one of the above items (1) to (14).

(16) A nonaqueous secondary cell comprising an electrolyte composition according to any one of the above items (1) to (14).

(17) A photoelectrochemical cell comprising:
a charge-transferring layer containing an electrolyte composition according to claim 1;
a photosensitive layer containing a semiconductor sensitized with a dye; and
a counter electrode.

(18) An ionic liquid crystal monomer represented by the following general formula (Ia):

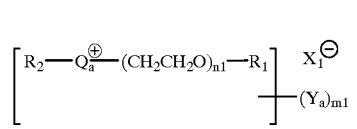

(Ia)

wherein $Q_a$ represents an organic atomic group which can form a heterocyclic cation containing nitrogen atom or a quaternary alkylammonium cation; $R_1$ represents an alkyl or alkenyl group; $R_2$ represents a substituent which imparts liquid crystallinity; $X_1^-$ represents an anion; $Y_a$ represents a polymerizable group comprising an ethylenically unsaturated group which substitutes on $R_1$, $R_2$ or $Q_a$; $n_1$ represents an integer of from 1 to 25; and $m_1$ represents an integer of from 1 to 4, with the proviso that when m1 is 2 or more, the plurality of $Y_a$'s may be the same or different and that the compound of the general formula (I) may be connected to each other at $R_1$ or $R_2$ to form a dimer, trimer or tetramer.

(19) The ionic liquid crystal monomer according to the above item (18), wherein $R_2$ in the general formula (Ia) is represented by the following general formula (II):

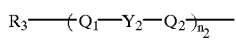
(II)

wherein $R_3$ represents an alkyl or alkenyl group; $Y_2$ represents a divalent 4-, 5-, 6- or 7-membered ring substituent or a condensed ring substituent formed thereby; $Q_1$ and $Q_2$ each represent a divalent substituent or a single bond; and $n_2$ represents an integer of from 1 to 3, with the proviso that when $n_2$ is 2 or 3, the plurality of $Y_2$'s, $Q_1$'s and $Q_2$'s may be the same or different, respectively.

(20) The liquid crystal monomer according to the above item (18) or (19), wherein the polymerizable group comprises a group selected from the group consisting of an acryloyl group, a methacryloyl group and a styryl group.

(21) The liquid crystal monomer according to any one of the above items (18) to (20), wherein $Y_a$ in the general formula (Ia) is represented by the following general formula (III):

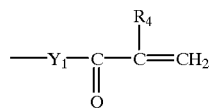
(III)

wherein $R_4$ represents a hydrogen atom or an alkyl group; —$Y_1$— represents —O—, —N($R_7$)— or a single bond; and $R_7$ represents a hydrogen atom or an alkyl group, with the proviso that when mi in the general formula is 2 or more, $R_4$ in the plurality of Y's may be the same or different.

(22) The liquid crystal monomer according to any one of the above items (18) to (21), wherein —$Q_a$— in the general formula (Ia) is represented by the following general formula (IV):

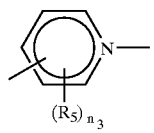
(IV)

wherein $R_5$ represents a substituent; and $n_3$ represents an integer of from 0 to 4, with the proviso that when $n_3$ is 2 or more, the plurality of $R_5$'s may be the same or different.

(23) The liquid crystal monomer according to any one of the above items (18) to (21), wherein —$Q_a$— in the general formula (Ia) is represented by the following general formula (V):

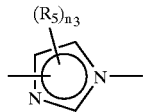
(V)

wherein $R_5$ represents a substituent; and $n_3$ represents an integer of from 0 to 3, with the proviso that when $n_3$ is 2 or more, the plurality of $R_5$'s may be the same or different.

(24) A polymer compound obtained by polymerizing an ionic liquid crystal monomer according to any one of the above items (18) to (23). The polymerization is preferably photopolymerization.

DETAILED DESCRIPTION OF THE INVENTION

Figure 1:
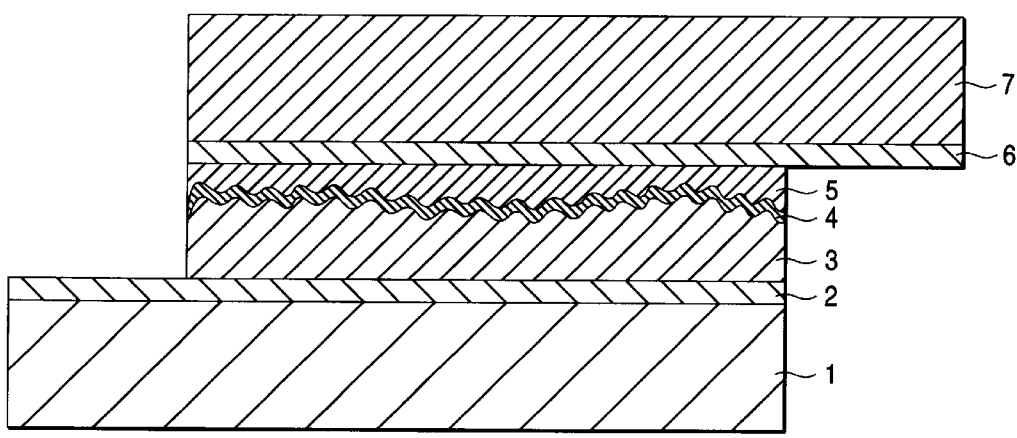
FIG. 1 is a sectional view illustrating the structure of the photoelectrochemical cell prepared in the Examples.

The present invention is described in more detail below.

The ionic liquid crystal monomer according to the invention is an ionic liquid crystal monomer comprising at least one polymerizable group. An ionic liquid crystal monomer is a liquid crystal compound having a cation moiety and an anion moiety. An ionic liquid crystal monomer has a so-called mesogen group as a structure which exhibits liquid crystallinity. The ionic liquid crystal monomer of the invention preferably has an ethylenically unsaturated group (e.g., acryloyl group, methacryloyl group, styryl group) as a polymerizable group and has an ethyleneoxy group in its molecule. The electrolyte comprising a polymer compound obtained by the polymerization of the ionic liquid crystal monomer of the invention can be used as a reaction solvent for chemical reaction or metal plating or can be used for CCD (charge coupled device) camera or various electrochemical cells (so-called cell). Preferably, the electrolyte of the invention is used for secondary lithium cell or the following photoelectrochemical cell comprising a semiconductor, more preferably photoelectrochemical cell.

In the case where an electrolyte comprising an ordinary low molecular solvent is incorporated in a cell, it is disadvantageous in that the evaporation of the solvent or the leakage of the electrolyte causes the deterioration of cell properties. On the other hand, a method has been known involving the use of a salt which stays liquid at room temperature, i.e., so-called molten salt as an electrolyte. Such an electrolyte has an extremely high melting point and thus is useful for the prevention of the deterioration of cell properties due to the evaporation of solvent. However, since such an electrolyte has a high viscosity and hence a low charge-transporting capability, the photoelectrochemical cell comprising such an electrolyte incorporated therein cannot attain a sufficient photoelectric conversion efficiency. The electrolyte obtained by the polymerization of the ionic compound exhibits a high charge-transporting capability while being kept in highly viscous liquid crystal state as compared with these electrolytes comprising a solvent or molten salt. Thus, the cell comprising such an electrolyte incorporated therein can maintain desired properties and thus can be prevented from being deteriorated in properties. The electrolyte of the invention has sufficient charge-transporting properties. Thus, the electrolyte of the invention exhibits an excellent photoelectric conversion efficiency particularly when incorporated in a photoelectrochemical cell.

The electrolyte obtained by the polymerization of the compound represented by the general formula (I) (preferably having a group represented by the general formula (II), (III), (IV) or (V) as a partial structure) will be further described hereinafter.

The ionic liquid crystal monomer compound of the invention (preferably the compound represented by the general formula (I) or (Ia)) forms a liquid crystal phase. The composition obtained by the polymerization of the ionic liquid crystal monomer compound of the invention is used as an electrolyte for electrochemical cell. A salt which stays liquid or stays in the state of solid having a low melting point at a temperature of 25° C., i.e., compound called molten salt has a higher boiling point than low molecular solvents and can be difficultly exhausted and thus is favorable in durability. Due to its high viscosity, however, a molten salt cannot exhibit high charge-transporting properties. On the contrary, the electrolyte obtained by the polymerization of the liquid crystal compound of the invention exhibits high charge-transporting properties while being kept highly viscous.

The electrolyte of the invention may be mixed with a solvent preferably in an amount of up to 50% by weight. However, in order to maintain a desired liquid crystallinity and realize excellent durability and photoelectric conversion efficiency, the ionic liquid crystal monomer compound of the invention (preferably the compound represented by the general formula (I) or (Ia)) is used preferably in an amount of 70% by weight or more, more preferably 80% by weight or more, most preferably 90% by weight or more.

Unlike ordinary solvents, the composition obtained by the polymerization of the compound of the general formula (I) doesn't substantially volatilize and thus can prevent the deterioration of properties of element due to volatilization to advantage. Since the composition of the invention exhibits not only an excellent durability but also a high ionic conductivity at low temperatures, it can be used as an electrolyte for secondary cell or dye-sensitized solar cell.

The compound of the general formula (I) or (Ia) preferably has a melting point of 100° C. or lower, more preferably 80° C. or lower, even more preferably 60° C. or lower. The compound of the general formula (I) or (Ia) preferably exhibits liquid crystallinity within the operating temperature range of cell or element.

The incorporation of the electrolyte of the invention can be accomplished by a process which comprises coating or impregnating the electrode with a solution obtained by heating the electrolyte or a process which comprises coating or impregnating the electrode with the electrolyte using a low boiling solvent (e.g., methanol, acetonitrile, methylene chloride), and then removing the solvent on heating.

Alternatively, the compound (I) or (Ia) of the invention may be incorporated in the electrode with a polymerization initiator, and then subjected to heat polymerization or photopolymerization.

The general formula (I) (including the general formula (Ia) as a subordinate concept) will be further described hereinafter.

In the general formula (I), —Q— represents an organic atomic group which can form a cation. $R_1$ represents an alkyl or alkenyl group $R_2$ represents a substituent which imparts liquid crystallinity (In short, —Q—$R_2$ represents a mesogen group). $X_1^-$ represents an anion. Y represents a polymerizable group which substitutes on $R_1$, $R_2$ or Q. The suffix $n_1$ represents an integer of from 1 to 25. The suffix $m_1$ represents an integer of from 1 to 4 When $m_1$ is 2 or more, the plurality of Y's may be the same or different. The compound of the general formula (I) may be connected to each other at $R_1$ or $R_2$ to form a dimer, trimer or tetramer. The suffix $m_1$ is preferably 1 or 2.

$R_1$ represents a substituted or unsubstituted alkyl group (preferably an alkyl group having from 1 to 24 carbon atoms which may be straight-chain or branched, e.g., methyl, ethyl, propyl, butyl, i-propyl, i-butyl, pentyl, hexyl, octyl, 2-ethylhexyl, t-octyl, decyl, dodecyl, tetradecyl, 2-hexyldecyl, hexadecyl, octadecyl, cyclohexylmethyl, octylcyclohexyl) or substituted or unsubstituted alkenyl group (preferably an alkenyl group having from 2 to 24 carbon atoms which may be straight-chain or branched, e.g., vinyl, allyl). Examples of the substituents on the alkyl or alkenyl group include aryl group which may be substituted or condensed (preferably an aryl group having from 6 to 24 carbon atoms, e.g., phenyl, 4-methylphenyl, 3-cyanophenyl, 2-chlorophenyl, 2-naphthyl), heterocyclic group which may be substituted or condensed (The nitrogen atom in the heterocyclic group, if it is a nitrogen-containing heterocyclic group, may be quaterized. The heterocyclic group is a heterocyclic group having from 2 to 24 carbon atoms, e.g., 4-pyridyl, 2-pyridyl, 1-octylpyridinium-4-il, 2-pyrimidyl, 2-imidazolyl, 2-thiazolyl), alkoxy group (preferably an alkoxy group having from 1 to 24 carbon atoms, e.g., methoxy, ethoxy, butoxy, octyloxy, methoxyethoxy, methoxypenta(ethyloxy), acryloyloxyethoxy, pentafluoropropoxy), acyloxy group (preferably an acyloxy group having from 1 to 24 carbon atoms, e.g., acetyloxy, benzoyloxy), alkoxycarbonyl group (preferably an alkoxycarbonyl group having from 2 to 24 carbon atoms, e.g., methoxycarbonyl, ethoxycarbonyl), cyano group, fluoro group, and group represented by Y. Preferred among these substituents are alkoxy group, alkoxycarbonyl group, cyano group, and the group represented by Y. Even more desirable among these substituents is alkyl group having from 1 to 10 carbon atoms. Particularly preferred among these substituents is $C_{2-6}$ straight-chain alkyl group substituted by Y.

—Q— is preferably an atomic group which can form a heterocyclic (preferably an aromatic 5-membered ring such as imidazole, pyrazole, triazole, oxazole and thiazole or aromatic 6-membered ring such as pyridine, pyrimidine, pyridazine, pyrazine and triazine) cation containing nitrogen or quaternary alkylammonium cation (corresponding to —$Q_a$— in the general formula (Ia)). The atomic group may contain substituents such as alkyl group, acyloxy group, heterocyclic group, cyano group, alkoxycarbonyl group, halogen atom, alkoxy group, alkenyl group and aryl group.

The atomic group represented by —Q— or —$Q_a$— is more preferably one represented by the general formula (IV) or (V). $R_5$ in the general formulae (IV) and (V) represents a substituent. The suffix $n_3$ in the general formula (IV) represents an integer of from 0 to 4. The suffix $n_3$ in the general formula (V) represents an integer of from 0 to 3. When $n_3$ is 2 or more, the plurality of $R_5$'s may be the same or different. The suffix $n_3$ in the general formulae (IV) and (V) is preferably 0.

Preferred examples of $R_5$ include alkyl group described with reference to $R_1$ in the general formulae (I) and (Ia) and those described as substituents on $R_1$. Even more desirable examples of $R_5$ include methyl group and groups represented by Y and $Y_a$.

In the general formula (IV), the bond hand preferably lies on the carbon atoms in the two pyridine rings at the 4-position. In the general formula (V), the two bond hands preferably lie on the nitrogen atom.

$R_2$ represents a substituent which imparts liquid crystallinity. The substituent represented by $R_2$ contains at least one divalent cyclic substituent and at least one substituted or unsubstituted alkyl or alkenyl group. The divalent cyclic substituent is a divalent aromatic group or divalent saturated or unsaturated cyclic aliphatic group. A plurality of such divalent cyclic substituents may be connected to each other with interlocking group or bond. $R_2$ has a structure comprising such a cyclic substituent having a substituted or unsubstituted alkyl or alkenyl group connected thereto at one end thereof.

$R_2$ in the general formulae (I) and (Ia) is preferably represented by the general formula (II). In the general formula (II), $R_3$ represents a substituted or unsubstituted alkyl group (preferably an alkyl group having from 1 to 24 carbon atoms which may be straight-chain or branched, e.g., methyl, ethyl, propyl, butyl, i-propyl, i-butyl, pentyl, hexyl, octyl, 2-ethylhexyl, t-octyl, decyl, dodecyl, tetradecyl, 2-hexyldecyl, hexadecyl, octadecyl, cyclohexylmethyl, octylcyclohexyl) or substituted or unsubstituted alkenyl group (preferably an alkenyl group having from 2 to 24 carbon atoms which may be straight-chain or branched, e.g., vinyl, allyl). Examples of the substituents on the alkyl or alkenyl group include aryl group which may be substituted or condensed (preferably an aryl group having from 6 to 24 carbon atoms, e.g., phenyl, 4-methylphenyl, 3-cyanophenyl, 2-chlorophenyl, 2-naphthyl), heterocyclic group which may be substituted or condensed (The nitrogen atom in the heterocyclic group, if it is a nitrogen-containing heterocyclic group, may be quaterized. The heterocyclic group is a heterocyclic group having from 2 to 24 carbon atoms, e.g., 4-pyridyl, 2-pyridyl, 1-octylpyridinium-4-il, 2-pyrimidyl, 2-imidazolyl, 2-thiazolyl), alkoxy group (preferably an alkoxy group having from 1 to 24 carbon atoms, e.g., methoxy, ethoxy, butoxy, octyloxy, methoxyethoxy, methoxypenta(ethyloxy), acryloyloxyethoxy, pentafluoropropoxy), acyloxy group (preferably an acyloxy group having from 1 to 24 carbon atoms, e.g., acetyloxy, benzoyloxy), alkoxycarbonyl group (preferably an alkoxycarbonyl group having from 2 to 24 carbon atoms, e.g., methoxycarbonyl, ethoxycarbonyl), cyano group, fluoro group, and group represented by Y. Preferred among these substituents are alkoxy group, alkoxycarbonyl group, cyano group, and the group represented by Y or $Y_a$. Even more desirable among these substituents is alkyl group having from 6 to 24 carbon atoms. Particularly preferred among these substituents is $C_{6-16}$ straight-chain alkyl group which may be unsubstituted or substituted by Y or $Y_a$.

In the general formula (II), Q1 and Q2 each represent a divalent interlocking group or single bond. Examples of the divalent interlocking group include —CH=CH—, —CH=N—, —N=N—, —NO=N—, —COO—, —COS—, CONH—, —COCH$_2$—, —CH$_2$CH$_2$—, —OCH$_2$—, —CH$_2$NH—, —CH$_2$—, —CO—, —O—, —S—, —NH—, —(CH$_2$)$_1$—, —(CH$_2$)$_2$—, —(CH$_2$)$_3$—, —CH=CH—COO—, —CH=CH—CO—, —(C≡C)$_1$—, —(C≡C)$_2$—, —(C≡C)$_3$—, and combination thereof. Even more desirable among these divalent interlocking groups are —CH$_2$—, —CO—, —O—, —CH=CH—, —CH=N—, —N=N—, and combination thereof. These interlocking groups may have substituents on the hydrogen atoms. A particularly preferred example of Q$_1$ and Q$_2$ is a single bond.

In the general formula (II), Y$_2$ represents a divalent 4-, 5-, 6- or 7-membered ring substituent or condensed ring substituent formed thereby. Preferred examples of these groups represented by Y$_2$ include 6-membered ring aromatic group, 4-, 5- or 6-membered ring saturated or unsaturated aliphatic group, 5- or 6-membered heterocyclic group, and ring obtained by the condensation of these rings. Examples of these groups include substituents represented by the following general formulae (Y-1) to (Y-27). A combination of these substituents may be used. Preferred among these substituents are (Y-1), (Y-2), (Y-18), (Y-19), (Y-21), and (Y-22). Even more desirable among these substituents are (Y-1), (Y-2), and (Y-21).

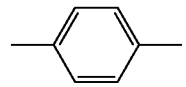
(Y-1)

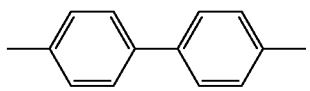
(Y-2)

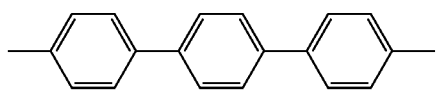
(Y-3)

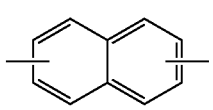
(Y-4)

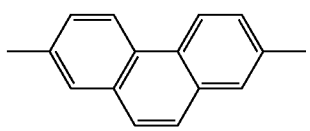
(Y-5)

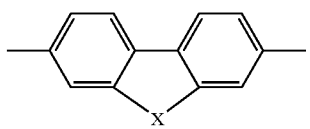
X = CH$_2$, O, CO, NH
(Y-6)

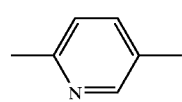
(Y-7)

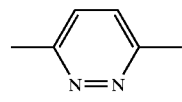
(Y-8)

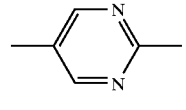
(Y-9)

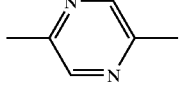
(Y-10)

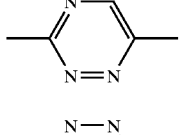
(Y-11)

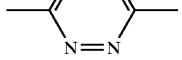
(Y-12)

In the general formula (II), $n_2$ represents an integer of from 1 to 3, preferably 1 or 2. When $n_3$ is 2 or 3, the plurality of combinations of $Q_1$, $Y_2$ and $Q_2$ may be the same or different.

In the general formula (I), Y represents a polymerizable group, more preferably an ethylenically unsaturated group (e.g., vinyl group, cinnamic residue), even more preferably an acryloyl group, methacryloyl group or styryl group, particularly a group represented by the general formula (III).

In the general formula (III), $R_4$ represents a hydrogen atom or alkyl group. —$Y_1$— represents —O—, —M($R_8$)— or a single bond. $R_8$ represents a hydrogen atom or alkyl group. When $m_2$ in the general formula (I) is 2 or more, $R_4$ in the plurality of Y's may be the same or different. When $m_2$ in the general formula (Ia) is 2 or more, $R_4$ in the plurality of $Y_a$'s may be the same or different.

The alkyl group represented by $R_4$ or $R_5$ is preferably one described as an example of $R_1$, more preferably a hydrogen atom or methyl group.

—$Y_1$— is preferably —O—.

Y or $Y_a$ preferably substitutes on $R_1$ or $R_2$, more preferably on $R_1$.

In the general formulae (I) and (Ia), $n_1$ represents an integer of from 1 to 25, preferably from 3 to 20, more preferably from 5 to 12.

In the general formulae (I) and (Ia), $X_1^-$ represents an anion. Preferred examples of the anion represented by $X_1^-$ include halogen anion (Cl$^-$, Br$^-$, I$^-$), amide anion (($CF_3SO_2$)$_2$N$^-$, ($CF_3CF_2SO_2$)$_2$N$^-$), iodine trimer anion ($I_3^-$), NCS$^-$, BF$_4^-$, PF$_6^-$, $O_4$Cl$^-$, $CF_3SO_3^-$, $CF_3COO^-$, and Ph$_4$B$^-$. Particularly preferred among these anions are iodine anion, amide anion (($CF_3SO_2$)$_2$N$^-$, ($CF_3CF_2SO_2$)$_2$N$^-$), and fluoride anion containing at least one element selected from the group consisting of boron (B), phosphorus (P) and sulfur (S) (BF4$^-$, PF$_6^-$, $CF_3SO_3^-$, C($CF_3SO_2$)$_3^-$)

Specific examples of the ionic liquid crystal monomer of the invention (including compounds represented by the general formulae (I) and (Ia) as subordinate concept) will be given below in the form of combination of cation and anion, but the present invention should not be construed as being limited thereto.

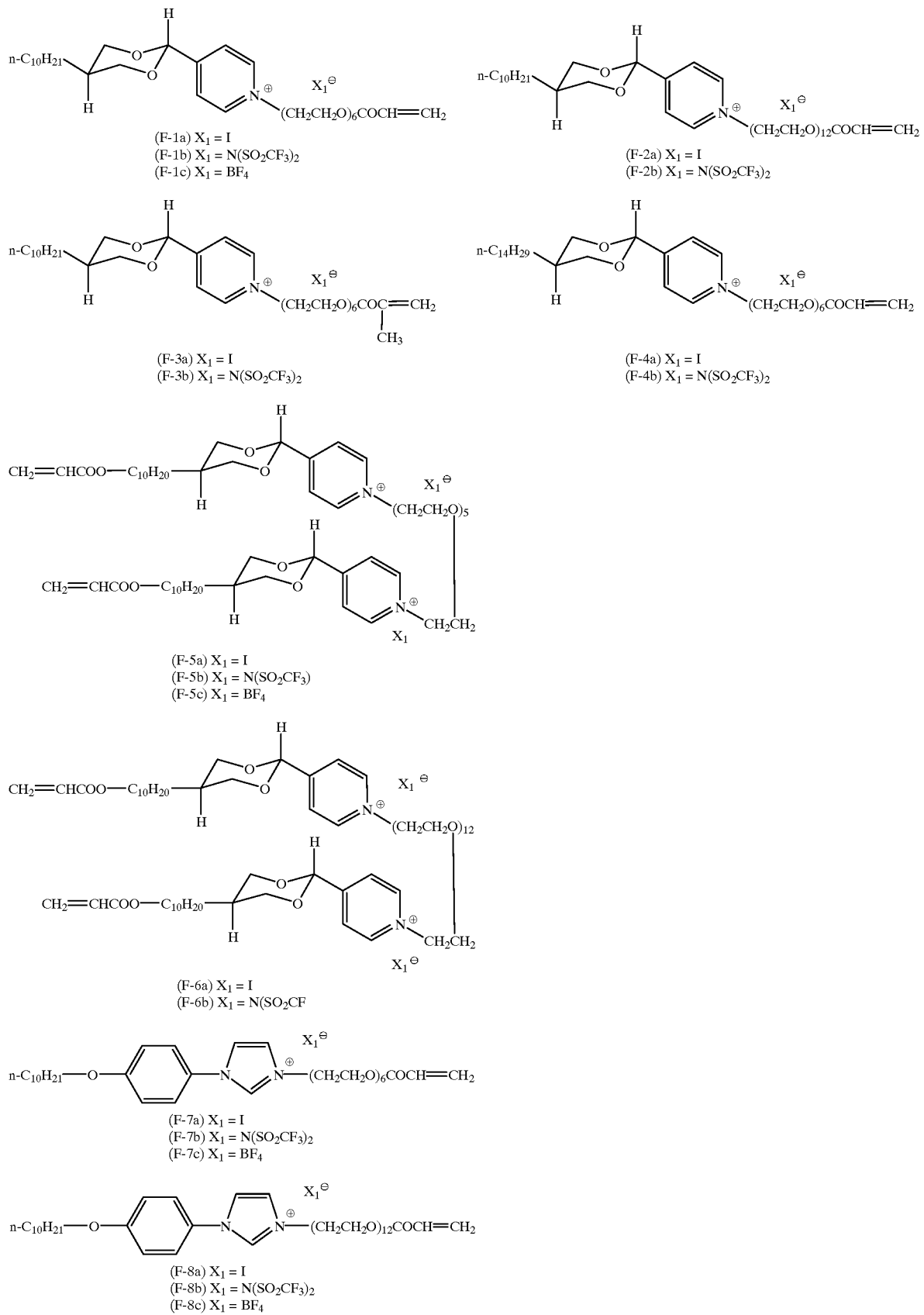

-continued
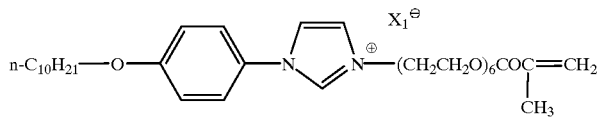
(F-9a) X₁ = I
(F-9b) X₁ = N(SO₂CF₃)₂
(F-9c) X₁ = BF₄
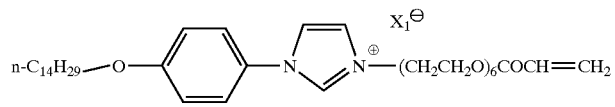
(F-10a) X₁ = I
(F-10b) X₁ = N(SO₂CF₃)₂
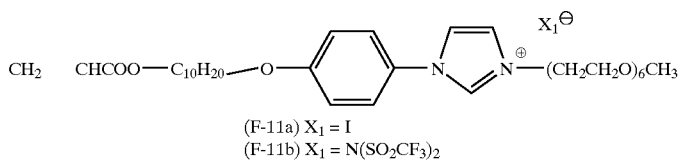
(F-11a) X₁ = I
(F-11b) X₁ = N(SO₂CF₃)₂
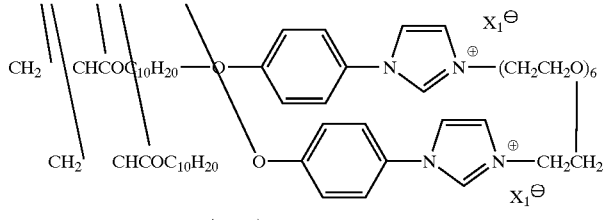
(F-12a) X₁ = I
(F-12b) X₁ = N(SO₂CF₃)₂
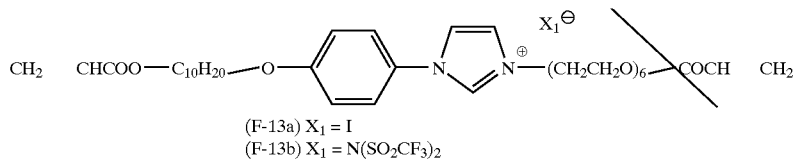
(F-13a) X₁ = I
(F-13b) X₁ = N(SO₂CF₃)₂
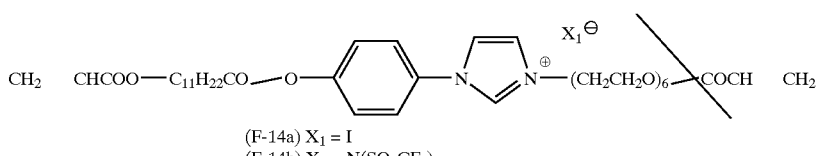
(F-14a) X₁ = I
(F-14b) X₁ = N(SO₂CF₃)₂
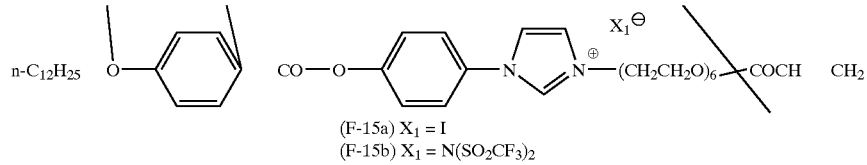
(F-15a) X₁ = I
(F-15b) X₁ = N(SO₂CF₃)₂
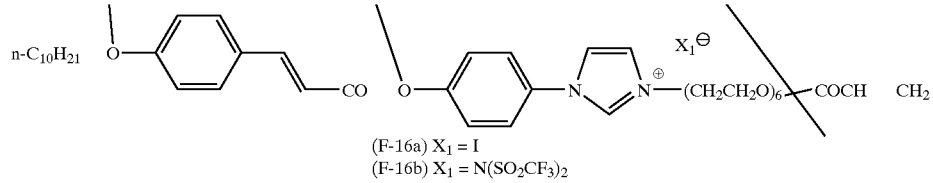
(F-16a) X₁ = I
(F-16b) X₁ = N(SO₂CF₃)₂

-continued
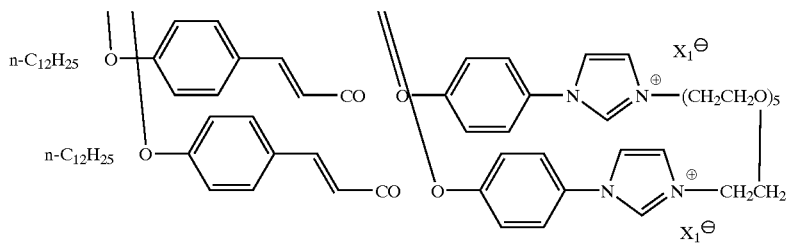
(F-17a) X₁ = I
(F-17b) X₁ = N(SO₂CF₃)₂
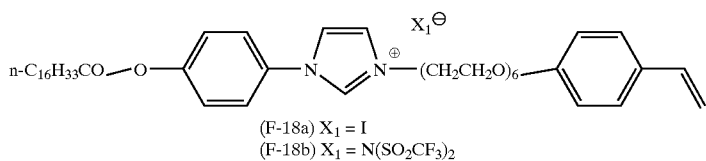
(F-18a) X₁ = I
(F-18b) X₁ = N(SO₂CF₃)₂
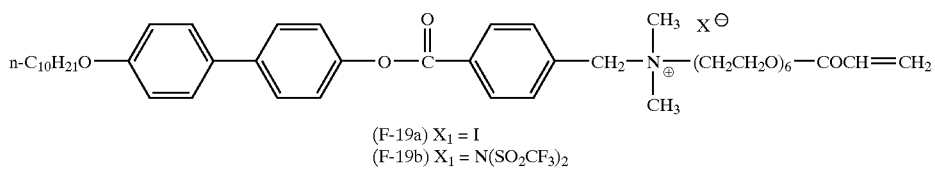
(F-19a) X₁ = I
(F-19b) X₁ = N(SO₂CF₃)₂
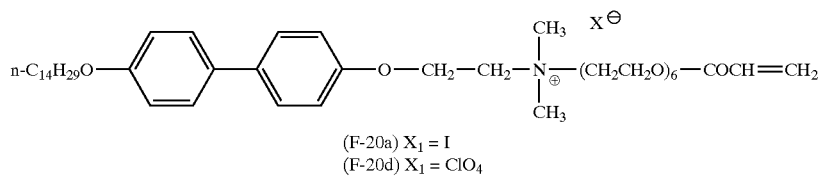
(F-20a) X₁ = I
(F-20d) X₁ = ClO₄
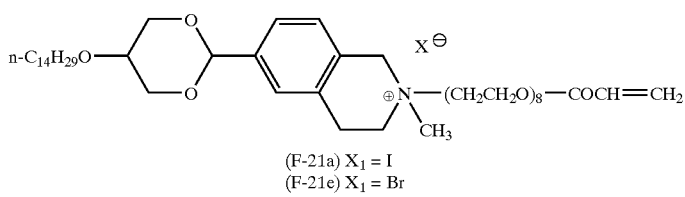
(F-21a) X₁ = I
(F-21e) X₁ = Br
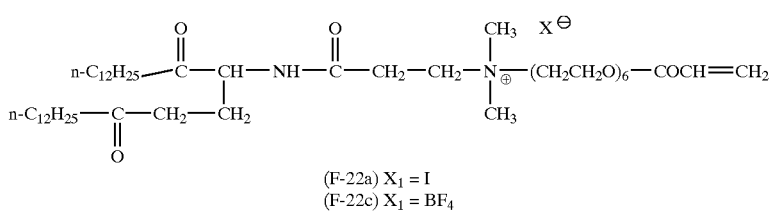
(F-22a) X₁ = I
(F-22c) X₁ = BF₄
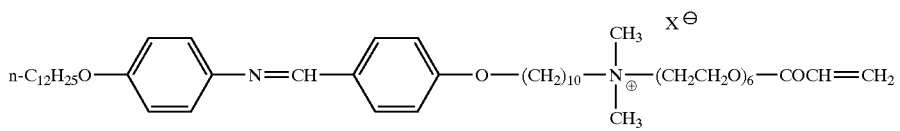
(F-23a) X₁ = I
(F-23c) X₁ = BF₄
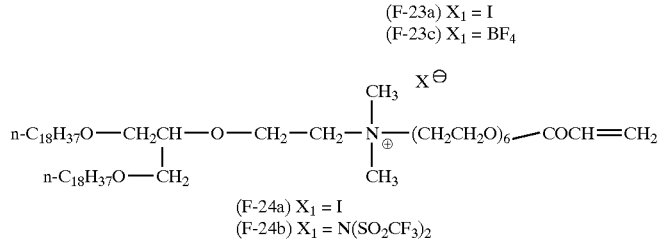
(F-24a) X₁ = I
(F-24b) X₁ = N(SO₂CF₃)₂

-continued

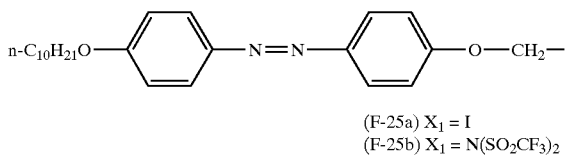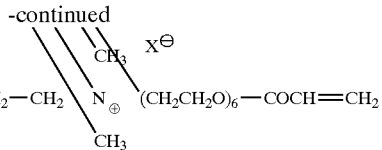

(F-25a) $X_1 = I$
(F-25b) $X_1 = N(SO_2CF_3)_2$

The polymerization of the ionic liquid crystal monomer (preferably the compound of the general formula (I) or (Ia)) can be accomplished by a radical polymerization process which is an ordinary polymer synthesis process described in Takayuki Otsu and Masayoshi Kinoshita, "Kobunshi Gosei no Jikkenho (Experimental Method for Polymer Synthesis)", Kagakudojin, and Takayuki Otsu, "Koza Jugo Hannouron 1—Rajikaru Jugo (Institute: Theory of Polymerization Reaction 1—Radical Polymerization (I))", Kagakudojin. Examples of the radical polymerization process include heat polymerization process using a heat polymerization initiator and photopolymerization process using a photopolymerization initiator. Examples of the heat polymerization initiator which can be preferably used herein include azo-based initiators such as 2,2'-azobis (isobutyronitrile), 2,2'-azobis(2,4-dimethylvalero nitrile) and dimethyl-2,2'-azobis(2-methylpropionate), and peroxide-based initiators such as benzoyl peroxide. Examples of the photopolymerization initiator which can be preferably used herein include α-carbonyl compound (as disclosed in U.S. Pat. Nos. 2,367,661 and 2,367,670), acyloin ether (as disclosed in U.S. Pat. No. 244,828), α-hyrocarbon-substituted aromatic acyloin compound (as disclosed in U.S. Pat. No. 2,722,512), polynuclear quinone compound (as disclosed in U.S. Pat. Nos. 3,046,127 and 2,951,758), combination of triarylimidazole dimer and p-aminophenylketone (as disclosed in U.S. Pat. No. 3,549,676), acridine compound and phenazine compound (as disclosed in JP-A-60-105667 (The term "JP-A" as used herein means an "unexamined published Japanese patent application") and U.S. Pat. No. 4,239,850), and oxadiazole compound (as disclosed in U.S. Pat. No. 4,212,970).

The amount of the polymerization initiator to be added is preferably from 0.01 to 20% by weight, more preferably from 0.1 to 10% by weight based on the total amount of the monomers.

The molecular weight (number-average molecular weight) of the polymer obtained by polymerization is preferably from 5,000 to 1,000,000, more preferably from 10,000 to 500,000, if the monomer of the invention is monofunctional. If the monomer of the invention is polyfunctional, or if the polymerization is effected in the presence of a crosslinking agent, the polymer having a molecular weight falling within the above defined range forms a three-dimensional network structure.

In the present invention, in order to attain a high charge-transporting capability, it is important that the ionic liquid crystal monomer compound of the invention (preferably the compound (I) or (Ia)) is polymerized such that its molecular orientation can be fixed at temperatures where it exhibits liquid crystal phase. Accordingly, it is preferred that the ionic liquid crystal monomer compound of the invention be subjected to heat polymerization at temperatures of not higher than the liquid crystal phase temperature or photopolymerization, which can be effected at low temperatures.

In particular, a photopolymerization process at low temperatures (not higher than the temperature where the monomer exhibits liquid crystal phase) is preferably used.

In the case where the electrolyte of the invention is used in an electrochemical cell such as lithium ion cell, $X_1^-$ is preferably an anion other than halogen ion, more preferably an amide anion $((CF_3SO_2)_2N^-, (CF_3CF_2SO_2)_2N^-)$ or fluoride anion containing at least one element selected from the group consisting of boron (B), phosphorus (P) and sulfur (S) $(BF_4^-, PF_6^-, CF_3SO_3^-, C(CF_3SO_2)_3^-)$. In this case, salts containing ions which form a carrier may be used in admixture. For example, if the electrolyte of the invention is used for lithium ion cell, salts such as $Li^+X_1^-$ (in which $X_1^-$ is as defined in the general formulae (I) and (Ia), excluding halogen ions) may be used in admixture. The concentration of the salt is preferably from 0.1 to 2 molar equivalent, more preferably from 0.3 to 1.5 molar equivalent based on the compound of the general formula (I) or (Ia).

If the electrolyte of the invention is used for photoelectrochemical cell, a plurality of compounds having different kinds of anions may be used at an arbitrary mixing ratio. Among these anions, the anion $X_1^-$ in at least one of these compounds is preferably $I^-$ and the anion $X_1^-$ in at least one of the rest of the compounds is preferably $I_3^-$. In this case, the content of $I_3^-$ is preferably from 0.1 to 50 mol-%, more preferably from 0.1 to 20 mol-%, even more preferably from 0.5 to 10 mol-%, most preferably from 0.5 to 5 mol % based on $I^-$.

If the anion $X_1^-$ is used in admixture with compounds other than $I^-$ and $I_3^-$, the mixing ratio of the anion is preferably from 0.1 to 90 mol-%, more preferably from 0.1 to 50 mol-%, even more preferably from 0.1 to 10 mol-% based on the total amount of $I^-$ and $I_3^-$. The compound containing $I_3^-$ as an anion can be easily synthesized by adding $I_2$ to a compound containing $I^-$. Accordingly, it is preferred that a predetermined amount of $I_2$ be added to a previously synthesized compound containing $I^-$ as an anion to obtain a mixture of compounds containing $I^-$ and $I_3^-$ as anion as an electrolyte.

The electrolyte of the invention may comprise a metal iodide such as LiI, NaI, KI, CsI and $CaI_2$, iodine salt such as quaternary imidazolium compound and tetraalkylammonium compound, metal iodide such as LiBr, NaBr, KBr, CsBr and $CaBr_2$, bromine salt of quaternary ammonium compound such as tetraalkylammonium bromide and pyridinium bromide, metal complex such as ferrocyanate-ferricyanate and ferrocene-ferricinium ion, sulfur compound such as polysodium sulfate and alkylthiol-alkyl disulfide, biologen dye, hydroquinone-quionone, etc. incorporated therein. The amount of these compounds, if incorporated, is preferably 30% by weight or less based on the total amount of the electrolyte compound.

In the invention, the ionic liquid crystal monomer compound (preferably the compound of the general formula (I) or (Ia)) can be used in combination with the following solvent preferably in the same amount as that of the ionic liquid crystal monomer compound at maximum.

The solvent to be used in the electrolyte of the invention is preferably a compound which exhibits a viscosity low enough to enhance the ionic mobility and a dielectric constant high enough to enhance the effective carrier concentration, making it possible to attain an excellent ionic conductivity. Examples of the solvent employable herein include carbonate compounds such as ethylene carbonate and propylene carbonate, heterocyclic compounds such as 3-methyl-2-oxazolidione, ether compounds such as dioxane and diethylether, chainlike ethers such as ethylene glycol dialkylether, propylene glycol dialkylether, polyethylene glycol dialkylether and polypropylene glycol dialkylether, alcohols such as methanol, ethanol, ethylene glycol monoalkylether, propylene glycol monoalkylether, polyethylene glycol monoalkylether and polypropylene glycol monoalkylether, polyvalent alcohols such as ethylene glycol, propylene glycol, polyethylene glycol, polypropylene glycol and glycerin, nitrile compounds such as acetonitrile, glutarodinitrile, methoxy acetonitrile, propionitrile and benzonitrile, esters such as carboxylic acid ester, phosphoric acid ester and phosphonic acid ester, aprotic polar materials such as dimethyl sulfoxide and sulfolan, and water. Particularly preferred among these solvents are carbonate compounds such as ethylene-carbonate and propylene carbonate, heterocyclic compounds such as 3-methyl-2-oxazolidinone, nitrile compounds such as acetonitrile, glutarodinitrile, methoxy acetonitrile, propionitrile and benzonitrile, and esters. These compounds may be used singly or in combination of two or more thereof.

The solvent to be used herein preferably has a boiling point of 200° C. or higher, more preferably 250° C. or higher, even more preferably 270° C. or higher at ordinary pressure (1 atm) from the standpoint of enhancement of durability by volatilization resistance.

The photoelectrochemical cell for which the electrolyte of the invention can be preferably used will be further described hereinafter. The photoelectrochemical cell of the invention comprises a photoelectric conversion element arranged to be used for a cell which works as an external circuit. The photoelectrochemical cell of the invention comprises a semiconductor sensitive to radiation, a charge-transferring layer and counter electrodes. The charge-transferring layer comprises the electrolyte of the invention incorporated therein.

In the present invention, the photoelectric conversion element comprises an electrically-conductive support, a semiconductor layer (photosensitive layer) provided on the electrically-conductive support, a charge-transferring layer, and a counter electrode. The photosensitive layer is designed depending on the purpose and may be in the form of single layer or multiple layer. In the present invention, the photosensitive layer, i.e., semiconductor layer is preferably sensitized with a dye. The light beam which is incident upon the photosensitive layer then excites the dye and other materials. The dye and other materials thus excited have high energy electrons. These electrons are transferred from the dye and other materials to the conduction band in the semiconductor particles, and then diffused to the electrically-conductive support. At this point, the molecules such as dye are in the form of oxide. In a photoelectrochemical cell, electrons on the electrically-conductive support are transferred to the external circuit where they work. The electrons are then returned to the oxide of the dye and other materials via the counter electrode and the charge-transferring layer to regenerate the dye and other materials. The semiconductor layer acts as the negative electrode for this cell. In the present invention, the constituents of the various layers may diffuse into each other at the interface of the various layers (e.g., interface of the electrically-conductive layer in the electrically-conductive support with the photosensitive layer, interface of the photosensitive layer with the charge-transferring layer, interface of the charge-transferring layer with the counter electrode). For example, the charge-transferring layer may not form a definite layer but may comprise the electrolyte partly or entirely incorporated in the layer of semiconductor particles.

In the present invention, the semiconductor is a so-called photoreceptor which acts to absorb light and separate charge, producing electrons and positive holes. In the dye-sensitized semiconductor, the absorption of light accompanying the generation of electrons and positive holes occurs mainly in the dye. The semiconductor acts to accept and transfer these electrons.

As the semiconductor there may be used a so-called compound semiconductor such as chalcogenide of metal (e.g., oxide, sulfide, selenide) or compound having a perovskite structure besides single semiconductor such as silicon and germanium. Preferred examples of the chalcogenide of metal employable herein include oxide of titanium, tin, zinc, iron, tungsten, zirconium, hafnium, strontium, indium, cerium, yttrium, lanthanum, vanadium, niobium and tantalum, sulfide of cadmium, zinc, lead, silver, antimony and bismuth, selenide of cadmium and lead, and telluride of cadmium. Other examples of the compound semiconductors include phosphide of zinc, gallium, indium and cadmium, allium-arsenic, copper-indium-selenide, and copper-indium-sulfide.

Preferred examples of the compounds having a perovskite structure include strontium titanate, calcium titanate, sodium titanate, barium titanate, and potassium niobate.

Specific preferred examples of the semiconductor employable herein include Si, $TiO_2$, $SnO_2$, $Fe_2O_3$, $WO_3$, ZnO, $Nb_2O_5$, CdS, ZnS, PbS, $Bi_2S_3$, CdSe, CdTe, GaP, InP, GaAs, $CuInS_2$, and $CuInSe_2$. Preferred among these semiconductors are $TiO_2$, ZnO, $SnO_2$, $Fe_2O_3$, $WO_3$, $Nb_2O_5$, CdS, PbS, CdSe, InP, GaAs, $CuInS_2$, and $CuInSe_2$. Particularly preferred among these semiconductors are $TiO_2$ and $Nb_2O_5$. Most desirable among these semiconductors is $TiO_2$.

The semiconductor to be used in the invention may be in the form of single crystal or polycrystal. The semiconductor of the invention is preferably in the form of single crystal from the standpoint of conversion efficiency. However, from the standpoint of production cost, availability of starting materials, energy payback time, the semiconductor of the invention is preferably in the form of polycrystal, particularly a particulate semiconductor having a size on the order of nanometer to micrometer.

The primary particle diameter of the particulate semiconductor is preferably from 5 to 200 nm, particularly from 8 to 100 nm as calculated in terms of average of diameter of circles having the same area as the projected area of particles. The average diameter of semiconductor particles (secondary particles) in the dispersion is preferably from 0.01 to 100 μm.

Two or more particulate semiconductor materials having different particle size distributions may be used in admixture. In this case, the average size of the smaller particles is preferably 5 nm or less. For the purpose of scattering the incident beam to enhance the percent trapping of light, a particulate semiconductor having a large particle size such as about 300 nm may be used in admixture with other particulate semiconductor materials.

The preparation of the particulate semiconductor is preferably accomplished by a sol-gel process as described in Sumio Sakubana, "Sol-Gel Ho no Kagaku (Science of Sol-Gel Process)", Agne Shofusha, 1988, and "Sol-Gel Ho niyoru Hakumaku Kotingu Gijutsu (Thin Film Coating Technique by Sol-Gel Process)", Gijutsu Joho Kyoukai, 1995, or a gel-sol process as described in Tadao Sugimoto, "Shingoseiho Gel-Sol Ho niyoru Tanbunnsan Ryushi no Gosei to Saizu Teitai Seigyo (Synthesis and Size Morphology Control of Monodisperse Particles by New Gel-Sol Synthesis Process)", Meteria, Vol. 35, No. 9, pp. 1,012–1,018 (1996).

A process developed by Degussa Inc. which comprises subjecting a chloride to high temperature hydrolysis in oxyhydrogen flame to prepare an oxide is preferably used.

The preparation of titanium oxide is preferably accomplished by any of the foregoing sol-gel process, gel-sol process and process which comprises subjecting a chloride to high temperature hydrolysis in oxyhydrogen flame. Alternatively, sulfuric acid process and chlorine process as described in Manabu Seino, "Sanka Titan—Bussei to Oyo Gijutsu (Titanium Oxide—Physical Properties and Applied Technique)", Gihodo, 1997, may be used.

In the case of titanium oxide, particularly preferred among the foregoing sol-gel processes are a method described in Barb et al., "Journal of American Ceramic Society", vol. 80, No. 12, pp. 3,157–3,171, 1997, and a method described in Barnside et al., "Chemistry of Materials", vol. 10, No. 9, pp. 2,419–2,425.

As the electrically-conductive support there may be used a material which is electrically conductive itself such as metal or a glass or plastic support having an electrically-conductive layer containing an electrically conducting agent (electrically conducting agent layer) provided on the surface thereof. Preferred examples of the electrically conducting agent to be incorporated in the latter, if used, include metal (e.g., platinum, gold, silver, copper, aluminum, rhodium, indium), carbon, and electrically-conductive metal oxide (e.g., indium-tin composite oxide, tin oxide doped with fluorine). The thickness of the foregoing electrically conducting agent layer is preferably from about 0.02 to 10 $\mu$m.

The surface resistivity of the electrically-conductive support is preferably as low as possible. The range of the surface resistivity of the electrically-conductive support is preferably 10 $\Omega$/square or less, more preferably 40 $\Omega$/square or less. The lower limit of the surface resistivity of the electrically-conductive support is not specifically limited. In practice, however, it is about 0.1 $\Omega$/square.

Preferably, the electrically-conductive support is substantially transparent. The term "substantially transparent" as used herein is meant to indicate that the light transmittance is 10% or more, preferably 50% or more, particularly 70% or more. As the transparent electrically-conductive support there may be used one obtained by applying an electrically-conductive metal oxide to glass or plastic. Particularly preferred among these materials is an electrically-conductive glass comprising an electrically-conductive layer made of tin dioxide doped with fluorine deposited on a transparent substrate made of a low cost soda-lime float glass. For a low cost flexible photoelectric conversion element or solar cell, an electrically-conductive support comprising such an electrically-conductive layer provided on a transparent polymer film is preferably used. Examples of the transparent polymer film employable herein include tetraacetyl cellulose (TAC), polyethylene terephthalate (PET), polyethylene naphthalate (PEN), syndiotactic polystyrene (SPS), polyphenylene sulfide (PPS), polycarbonate (PC), polyarylate (PAr), polysulfone (PSF), polyestersulfone (PES), polyetherimide (PEI), cyclic polyolefin, and bromated phenoxy. In the case where such a transparent electrically-conductive support is used, light is preferably incident upon the element on the support side thereof. In this structure, the coated amount of the electrically-conductive metal oxide is from 0.01 to 100 g per $m^2$ of glass or plastic support.

For the purpose of lowering the resistivity of the transparent electrically-conductive substrate, a metallic lead is preferably used. The metallic lead is preferably made of a metal such as aluminum, copper, silver, gold, platinum or nickel, particularly aluminum or silver. The metallic lead may be vacuum-evaporated or sputtered onto a transparent substrate. A transparent electrically-conductive layer made of tin oxide doped with fluorine or ITO layer is preferably provided on the metallic lead. Alternatively, the metallic lead is preferably provided on the foregoing transparent electrically-conductive layer provided on a transparent substrate. The reduction of the amount of incident beam due to the provision of the metallic lead is preferably from 1 to 10%, more preferably from 1 to 5%.

The application of the particulate semiconductor to the electrically-conductive support can be accomplished by a process which comprises coating the electrically-conductive support with a dispersion or colloidal solution of particulate semiconductor or the foregoing sol-gel process. Taking into account the mass producibility of photoelectric conversion element, physical properties of electrolyte, and the flexibility of support, a wet film-forming process is relatively advantageous. Representative examples of wet film-forming method include coating method, and printing method.

Examples of the method for the preparation of a dispersion of particulate semiconductor include the foregoing sol-gel method, method which comprises crushing semiconductor in a mortar, method which comprises crushing semiconductor during dispersion, and method which comprises allowing the precipitation of particulate semiconductor in a solvent during its synthesis, and then using it as it is. Examples of the dispersion medium to be used herein include water and various organic solvents (e.g., methanol, ethanol, isopropyl alcohol, dichloromethane, acetone, acetonitrile, ethyl acetate). During dispersion, a polymer, a surface active agent, an acid, a chelating agent or the like may be used as a dispersing aid as necessary.

Preferred examples of the coating method employable herein include application-based method such as roller method and dip method, metering-based method such as air knife method and blade method, and method allowing application-based method and metering-based method at the same area, such as wire bar method disclosed in JP-B-58-4589 (The term "JP-B" as used herein means an "examined Japanese patent application") and slide hopper method, extrusion method and curtain method described in U.S. Pat. Nos. 2,681,294, 2,761,419 and 2,761,791. As a method using a general-purpose machine there is preferably used spin method or spray method.

Preferred examples of the wet printing method employable herein include three major printing methods, i.e., letterpress printing, offset printing and gravure printing, intaglio printing, rubber plate printing and screen printing.

A preferred film-forming method is selected from these methods depending on the liquid viscosity and wet thickness.

The viscosity of the dispersion of particulate semiconductor depends greatly on the kind and dispersibility of the particulate semiconductor, the kind of the solvent used, and additives such as surface active agent and binder. When a solution having a viscosity as high as from 0.01 to 500 poise is used, extrusion method, casting method, etc. may be used. When a solution having a viscosity as low as 0.1 poise or less is used, slide hopper method, wire bar method or spin method is preferred. These methods can form a uniform film.

If a certain amount of solution can be applied, extrusion method can be applied even to a low viscosity solution.

For the coating of a high viscosity paste of particulate semiconductor, screen printing is often used. Thus, this coating method may be used.

Thus, wet film-forming method may be properly selected depending on parameters such as the viscosity of the coating solution, the applied amount of the coating solution, the kind of the support, the coating speed, etc.

The particulate semiconductor layer may not necessarily consist of a single layer but may be formed by applying a plurality of dispersions of particulate semiconductor having different particle diameters or coat layers containing different particulate semiconductors or different binders or additives. Even if the thickness of a layer attained by one coating is insufficient, the multi-layer coating method can work well. The multi-layer coating is preferably accomplished by extrusion method or slide hopper method. In the case where multi-layer coating is effected, a plurality of layers may be applied at the same time. Alternatively, a plurality of layers may be applied in sequence. If sequential multi-layer coating is effected, screen printing method is preferably employed.

In general, the more the thickness of the particulate semiconductor-containing layer is, the more is the amount of dye supported per unit projected area and the higher is the percent trapping of light, but the more is the diffusion distance of the resulting electrons and the greater is the loss due to recombination of electric charge. Accordingly, the particulate semiconductor layer has a desirable thickness. It is typically from 0.1 µm to 100 µm. The thickness of the particulate semiconductor-containing layer, if used in photoelectrochemical cell, is preferably from 1 µm to 30 µm, more preferably from 2 µm to 25 µm. The coated amount of the particulate semiconductor per m² of the support is preferably from 0.5 g to 400 g, more preferably from 5 g to 100 g.

The application of the particulate semiconductor to the electrically-conductive support is preferably followed by the electronic connection of the semiconductor particles as well as heat treatment for the purpose of enhancing the coat layer strength or the adhesivity to the support. The heating temperature is preferably from 40° C. to lower than 700° C., more preferably from 100° C. to not higher than 600° C. The heating time is from about 10 minutes to 10 hours. In the case where a support having a low melting point or softening point such as polymer film is used, high temperature treatment causes deterioration of the support to disadvantage. From the standpoint of cost, too, the heating temperature is preferably as low as possible. The lowering of the heating temperature can be accomplished by the use of the foregoing particulate semiconductor having a particle diameter as small as 5 nm or less or heating in the presence of a mineral acid.

For the purpose of increasing the surface area of the particulate semiconductor thus heat-treated or enhancing the purity in the vicinity of the particulate semiconductor to increase the efficiency of injection of electrons from the dye to the semiconductor particles, chemical plating using an aqueous solution of titanium tetrachloride or electrochemical plating using an aqueous solution of titanium tetrachloride may be effected.

The particulate semiconductor preferably has a great surface area so that it can adsorb many dye particles. To this end, the surface area of the particulate semiconductor layer applied to the support is preferably 10 or more times, more preferably 100 or more times the projected area. The upper limit of the surface area of the particulate semiconductor layer is not specifically limited. In practice, however, it is normally about 1,000 times.

As the dye to be incorporated in the photosensitive layer there is preferably used a metal complex dye, phthalocyanine-based dye or methine dye. In order to widen the wavelength range where photoelectric conversion is effected as much as possible and raise the conversion efficiency, two or more dyes may be used in admixture. The dyes to be mixed and their mixing ratio can be selected to attain the desired wavelength range and intensity distribution of light source.

The foregoing dye preferably has a proper interlocking group with respect to the surface of the particulate semiconductor. Preferred examples of such an interlocking group include COOH group, OH group, $SO_3H$ group, cyano group, —P(O) $(OH)_2$ group, —OP(O) $(OH)_2$ group, and chelating group having $\pi$ conductivity such as oxim, dioxim, hydroxyquinoline, salicylate and α-ketoenolate. Particularly preferred among these interlocking groups are COOH group, —P(O) $(OH)_2$ group, and —OP(O) $(OH)_2$ group. These groups may form a salt with an alkaline metal salt or the like or may form an intramolecular salt. In the case where a polymethine dye is used, if it contains an acidic group as in the case where methine chain forms a squarilium ring or croconium ring, this moiety may act as an interlocking group.

Specific examples of dyes which can be preferably used in the invention will be described hereinafter.

(a) Metal Complex Dye:

If the dye is a metal complex dye, the metal atom is preferably ruthenium Ru. Examples of the ruthenium complex dye employable herein include complex dyes disclosed in U.S. Pat. Nos. 4,927,721, 4,684,537, 5,084,365, 5,350, 644, 5,463,057, and 5,525,440, JP-A-7-249790 (The term "JP-A" as used herein means an "unexamined published Japanese patent application"), JP-W-10-504512 (The term "JP-W" as used herein means a "published Japanese natinal stage of international application"), and WO98/50393.

The ruthenium complex dye to be used in the invention is preferably represented by the following general formula (D):

$$(A_1)_p Ru(B-a) (B-b) (B-c) \qquad (D)$$

In the general formula (I), Al represents a ligand selected from the group consisting of Cl, SCN, H2O, Br, I, CN, NCO and SeCN. The suffix p represents an integer of from 0 to 3, preferably 2. B-a, B-b and B-c each independently represent an organic ligand selected from the group consisting of compounds represented by the following general formulae B-1 to B-8:

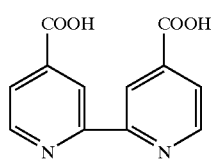

B-1

B-2
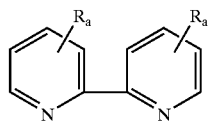

B-3
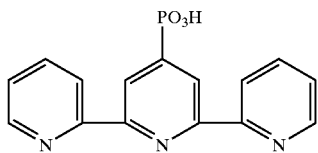

B-4
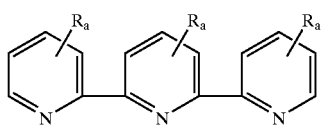

B-5
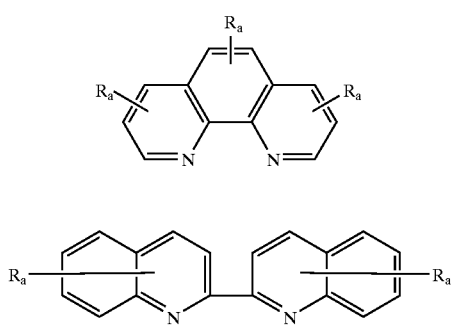

B-6
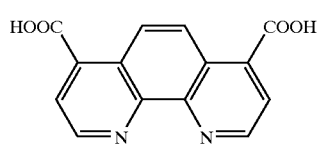

B-7
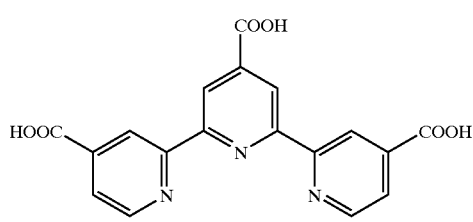

B-8
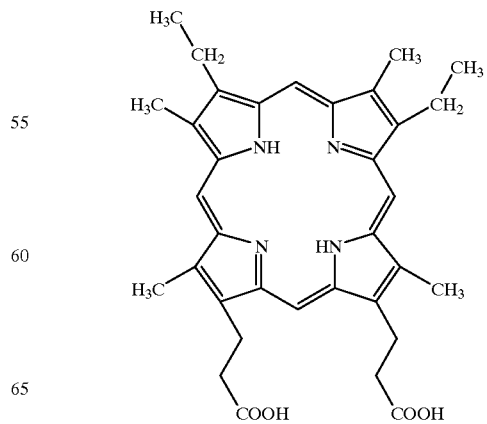

wherein $R_a$ represents a hydrogen atom or substituent such as halogen atom, $C_{1-12}$ substituted or unsubstituted alkyl group, $C_{7-12}$ substituted or unsubstituted aralkyl group, $C_{6-12}$ substituted or unsubstituted aryl, carboxylic acid or phosphoric acid group (these acid groups may form a salt), and with the proviso that the alkyl moiety of the alkyl group the aralkyl group may be straight-chain or branched and the aryl moiety of the aryl group and aralkyl group may be monocyclic or polycyclic (condensed ring, aggregation of rings). B-a, B-b and B-c may be the same or different.

Specific preferred examples of the metal complex salt will be listed below, but the present invention should not be construed as being limited thereto.

| No. | $A_1$ | p | B-a | B-b | B-c | Ra |
|---|---|---|---|---|---|---|
| R-1 | SCN | 2 | B-1 | B-1 | — | — |
| R-2 | CN | 2 | B-1 | B-1 | — | — |
| R-3 | Cl | 2 | B-1 | B-1 | — | — |
| R-4 | CN | 2 | B-7 | B-7 | — | — |
| R-5 | SCN | 2 | B-7 | B-7 | — | — |
| R-6 | SCN | 2 | B-1 | B-2 | — | 4,4'-COO$^-$N$^+$(C$_4$H$_9$-n)$_4$ |
| R-7 | SCN | 1 | B-1 | B-3 | — | — |
| R-8 | Cl | 1 | B-1 | B-4 | — | H |
| R-9 | I | 2 | B-1 | B-5 | — | H |
| R-10 | SCN | 3 | B-8 | — | — | — |
| R-11 | CN | 3 | B-8 | — | — | — |
| R-12 | SCN | 1 | B-8 | B-2 | — | 4,4'-COO$^-$N$^+$(C$_4$H$_9$-n)$_4$ |
| R-13 | — | 0 | B-1 | B-1 | B-1 | — |

R-14
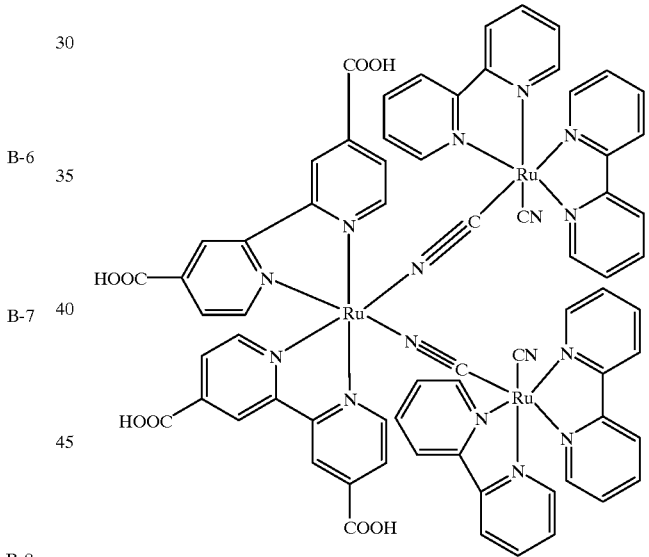

R-15

-continued
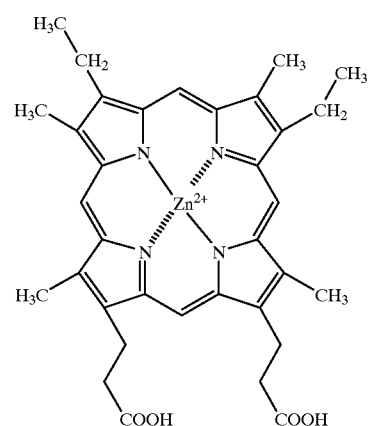
R-16
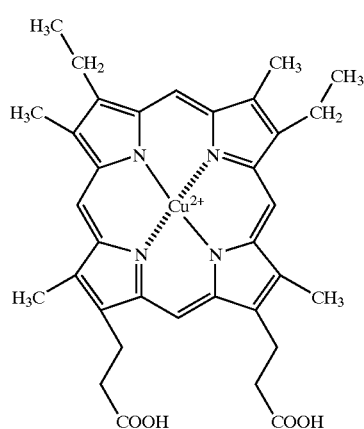
R-17
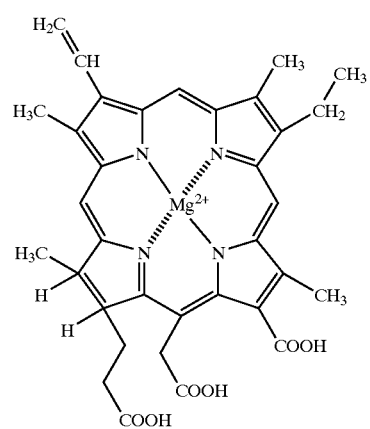
R-18
-continued
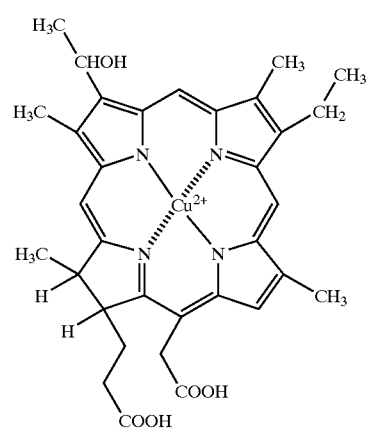
R-19
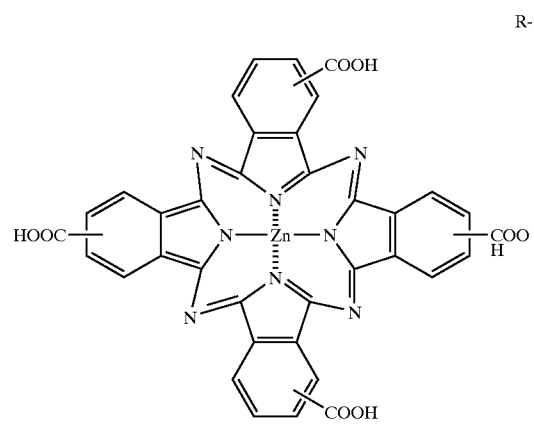
R-20
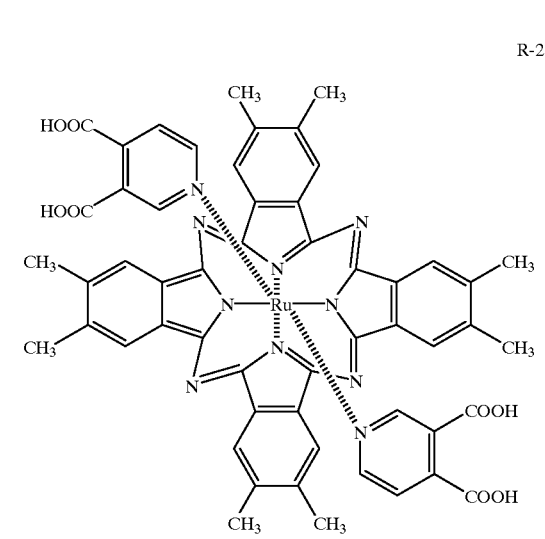
R-21

(b) Methine Dye:

The methine dye which can be preferably used in the invention is a dye described in JP-A-11-35836, JP-A-11-158395, JP-A-11-163378, JP-A-11-214730, JP-A-11-214731, EP892411, and EP911841. For the details of method for the synthesis of these dyes, reference can be made to F. M. Hamer, "Heterocyclic Compounds-Cyanine Dyes and Related Compounds", John Wiley & Sons, New York, London, 1964, D. M. Sturmer, "Heterocyclic Compounds-Special Topics in Heterocyclic Chemistry", Chapter 18, Section 14, pp. 482–515, John Wiley & Sons, New York, London, 1977, "Rodd's Chemistry of Carbon Compounds", 2nd Ed., Vol. IV, part B, 1977, Chapter 15, pp. 369–422, Elsevier Science Publishing Company Inc., New York, British Patent 1,077,611, Ukrainskii Khimischeskii Zhurnal, vol. 40, No. 3, pp. 253–258, Dyes and Pigments, vol. 21, pp. 227–234, and literatures cited in these references.

In order to allow the dye to be adsorbed by the particulate semiconductor, it is normally practiced to dip the particulate semiconductor which has been thoroughly dried in a solution of the dye or the like for several hours. The adsorption of the dye may be effected at room temperature or may be effected on heating under reflux as described in JP-A-7-249790. The adsorption of the dye may be effected before or after the application of the particulate semiconductor to the electrically-conductive support. The particulate semiconductor and the dye or the like may be simultaneously applied to the electrically-conductive support so that the dye is adsorbed by the particulate semiconductor. However, it is preferred that the dye be adsorbed by the particulate semiconductor layer which has been previously applied.

In order to allow the dye to be adsorbed by the particulate semiconductor layer which has been applied to the electrically-conductive support, a particulate semiconductor layer which has been thoroughly dried can be dipped in a dye solution or a dye solution may be applied to the particulate semiconductor layer. In the case of the former method, dip method, roller method, air knife method or the like can be employed. Examples of the latter method, if it is coating method, include wire bar method, slide hopper method, extrusion method, curtain method, spin method, and spray method. Examples of the latter method, if it is printing method, include letterpress printing, offset printing, gravure printing, and screen printing.

Referring to the viscosity of the dye solution, if a high viscosity solution (e.g., 0.01 to 500 poise) is used, various printing methods may be used besides extrusion method while if a low viscosity solution (e.g., 0.1 poise or less) is used, slide hopper method, wire bar method or spin method may be used, as in the case where the particulate semiconductor layer is formed. Any of these methods can form a uniform coat layer.

Thus, the method for the application of a dye can be properly selected depending on parameters such as the viscosity of the dye coating solution, the applied amount of the dye coating solution, the kind of the support, coating speed, etc. The time required until the particulate semiconductor adsorbs dye thus applied is preferably as short as possible taking into account mass producibility.

The total amount of the dye to be used is preferably from 0.01 to 100 mmol per unit surface area (1 m$^2$) of the electrically-conductive support. The amount of the dye to be adsorbed by the particulate semiconductor is preferably from 0.01 to 1 mmol per g of the particulate semiconductor. With this adsorbed amount, the dye can exert a sufficient effect of sensitizing the semiconductor. On the contrary, when the adsorbed amount of the dye is too small, the resulting sensitizing effect is insufficient. When the adsorbed amount of the dye is too great, the dye which is not adsorbed by the semiconductor is suspended, causing the deterioration of the sensitizing effect.

The presence of unadsorbed dye causes disturbance of the properties of the element. Thus, the unadsorbed dye is preferably removed rapidly after adsorption. It is preferred that the coated material be cleaned with a polar solvent such as acetonitrile or an organic solvent such as alcohol solvent in a wet cleaning tank. In order to increase the amount of the dye to be adsorbed, the particulate semiconductor layer is preferably subjected to heat treatment before adsorption. In order to prevent water from being adsorbed by the surface of the particulate semiconductor, the heat treatment is preferably immediately followed by the adsorption of the dye at a temperature of from 40° C. to 80° C. by the time when the temperature is returned to room temperature.

For the purpose of lessening interaction such as association of dye particles, a colorless compound may be adsorbed to the particulate semiconductor in combination with the dye. Examples of a hydrophobic compound to be co-adsorbed include steroid compound having carboxyl group (e.g., chenodeoxycholic acid).

For the purpose of preventing the deterioration by ultraviolet rays, an ultraviolet absorber may be used as well.

For the purpose of accelerating the removal of excess dye, the adsorption of the dye may be followed by the treatment of the surface of the particulate semiconductor with amines. Preferred examples of amines include pyridine, 4-t-butylpyridine, and polyvinylpyridine. Such an amine, if it is liquid, may be used as it is or may be used in the form of solution in an organic solvent.

There are two possible methods for the formation of the charge-transferring layer. One of the two methods comprises inserting a liquid charge-transferring layer into the gap between a particulate semiconductor-containing layer having a sensitizing dye supported thereon and a counter electrode applied thereof. The other comprises directly applying a charge-transferring layer to a particulate semiconductor-containing layer, and then applying a counter electrode to the charge-transferring layer.

In the former method, the insertion of the charge-transferring layer can be accomplished by an ordinary pressure process involving capillarity by dipping or a vacuum process involving the substitution of liquid phase for gas phase at a pressure lower than ordinary pressure.

In the latter method, the application of the charge-transferring layer can be accomplished by dipping process, roller process, air knife process, extrusion process, slide hopper process, wire bar process, spin process, spray process, casting process, various printing processes or the like as in the application of the particulate semiconductor-containing layer or dye. The thickness of the charge-transferring layer containing the electrolyte of the invention is preferably from 0.001 to 200 μm, more preferably from 0.1 to 100 μm.

The counter electrode acts as a positive electrode for photoelectrochemical cell when the photoelectric conversion element is used as a photoelectrochemical cell. The counter electrode normally has the same meaning as the foregoing electrically-conductive support. However, the structure by which a sufficient strength can be maintained doesn't necessarily require a support. Nevertheless, a structure having a support is favorable in sealability.

In order to allow light to reach the photosensitive layer, at least one of the electrically-conductive support and the counter electrode must be substantially transparent. In the photoelectrochemical cell of the invention, the electrically-conductive support is preferably transparent so that sunlight can enter into the photoelectric element on the electrically-conductive support side thereof. In this case, the counter electrode is preferably capable of reflecting light.

As the counter electrode for photoelectrochemical cell there may be used a metal or a glass or plastic having an electrically-conductive oxide vacuum-deposited thereon. Alternatively, the counter electrode can be prepared by vacuum-evaporating or sputtering a metal to a thickness as small as 5 μm or less, preferably from 5 nm to 3 μm. In the invention, glass having platinum vacuum-deposited thereon or a thin metal film formed by vacuum evaporation or sputtering is preferably used as the counter electrode.

The side face of the photoelectrochemical cell of the invention may be sealed with a polymer, an adhesive or the like to prevent the oxidative deterioration of the constituents of the cell.

The secondary cell in which the electrolyte of the invention can be preferably incorporated will be further described hereinafter. If the electrolyte of the invention is used in the secondary cell, the active positive electrode material to be used herein may be a transition metal oxide capable of reversibly occluding/releasing lithium ion, preferably a lithium-containing transition metal oxide in particular. Preferred examples of the lithium-containing transition metal oxide active positive electrode material include oxide of Ti, V, Cr, Mn, Fe, Co, Ni, Cu, Mo and W containing lithium. The active positive electrode material may comprise an alkaline metal other than lithium (element belonging to the groups 1-(IA) and 2-(IIa) in the periodic table) and/or Al, Ga, In, Ge, Sn, Pb, Sb, Bi, Si, P and B incorporated therein. The amount of these ingredients to be incorporated in the transition metal is preferably from 0 to 30 mol-%.

The synthesis of even more desirable lithium-containing transition metal oxide active positive electrode material to be used in the invention is preferably accomplished such that the total molar ratio of lithium compound to transition metal compound (at least one selected from the group consisting of Ti, V, Cr, Mn, Fe, Co, Ni, Mo and W) is from 0.3 to 2.2.

The synthesis of particularly preferred lithium-containing transition metal oxide active positive electrode material to be used in the invention is preferably accomplished such that the total molar ratio of lithium compound to transition metal compound (at least one selected from the group consisting of V, Cr, Mn, Fe, Co and Ni) is from 0.3 to 2.2.

The particularly preferred lithium-containing transition metal oxide active positive electrode material to be used in the invention is a material containing $Li_gM^3O_2$ (in which $M^3$ is one or more selected from the group consisting of Co, Ni, Fe and Mn; and g is a number of from 0 to 1.2) or a material having a spinner structure represented by $Li_hM^4{}_2O_4$ (in which M4 is Mn; and h is a number of from 0 to 2). $M^3$ and $M^4$ each may comprise Al, Ga, IN, Ge, Sn, Pb, Sb, Bi, Si, P, B, etc. incorporated therein besides the transition metal. The amount of these ingredients to be incorporated is preferably from 0 to 30 mol-%.

Most desirable examples of the lithium-containing transition metal oxide active positive electrode material to be used in the invention include $Li_gCoO_2$, $Li_gNiO_2$, $Li_gMnO_2$, $Li_gCo_jNi_{1-j}O_2$, and $Li_hMn_2O_4$ (in which g is a number of from 0.02 to 1.2; j is a number of from 0.1 to 0.9; and h is a number of from 0 to 2). The foregoing values of g and h are initial values and increases or decreases as charging or discharging proceeds.

The synthesis of the active positive electrode material can be accomplished by a process which comprises calcining a mixture of a lithium compound and a transition metal compound or a solution reaction. The calcining process is particularly preferred. The calcining temperature to be used herein may be such that the compounds used in admixture can be partly decomposed or melted, preferably from 250° C. to 2,000° C., particularly from 350° C. to 1,500° C. for example. The calcining is preferably effected at a temperature of from 250° C. to 900° C. The calcining time is preferably from 1 to 72 hours, more preferably from 2 to 20 hours. The mixing of the starting materials may be carried out by a dry or wet process. The material thus calcined may be then annealed at a temperature of from 200° C. to 900° C.

The calcining gas atmosphere is not specifically limited. Any of an oxidizing atmosphere and a reducing atmosphere may be used. For example, air, gas having an arbitrarily adjusted oxygen concentration, hydrogen, carbon monoxide, nitrogen, argon, helium, krypton, xenon, carbon dioxide, etc. can be used.

The average particle size of the active positive electrode material to be used in the invention is not specifically limited. In practice, however, it is preferably from 0.1 μm to 50 μm. The specific surface area of the active positive electrode material is not specifically limited. In practice, however, it is preferably from 0.01 to 50 $m^2/g$ according to BET method. The pH value of the supernatant liquid developed when 5 g of the active positive electrode material is dissolved in 100 ml of distilled water is preferably from 7 to 12.

The predetermined particle size can be attained by the use of a well-known grinder or classifier. Examples of such a grinder or classifier employable herein include mortar, ball mill, oscillating ball mill, oscillating mill, satellite ball mill, planetary ball mill, pivoted air flow type jet mill, and sieve.

The active positive electrode material obtained by calcining may be washed with water, an acidic aqueous solution, an alkaline aqueous solution or an organic solvent before use.

One of the active negative electrode material to be used in the invention is a carbon-based material capable of occluding/releasing lithium. A carbon-based material is a material substantially made of carbon. Examples of the carbon-based material include petroleum pitch, natural graphite, artificial graphite such as gas phase-grown graphite, and carbon-based material obtained by calcining various synthetic resins such as PAN-based resin and furfuryl alcohol resin. Further examples of the carbon-based material include various carbon fibers such as PAN-based carbon fiber, cellulose-based carbon fiber, pitch-based carbon fiber, gas phase-grown carbon fiber, dehydrated PVA-based carbon fiber, lignin-based carbon fiber, glassy carbon fiber and active carbon fiber, mesophase microsphere, graphite whisker, and tabular graphite.

These carbon-based materials can be classified as difficultly-graphitized carbon-based material and graphite-based carbon material by the degree of graphitization. The carbon-based material preferably has a spacing, density and crystallite size as described in JP-A-62-22066, JP-A-2-6856 and JP-A-3-45473.

The carbon-based material doesn't necessarily need to be made of a single material. The carbon-based material may be made of a mixture of natural graphite and artificial graphite as described in JP-A-5-90844, graphite having a coat layer as described in JP-A-6-4516 or the like.

Another active negative electrode material to be used in the invention is an oxide and/or chalcogenide.

In particular, an amorphous oxide and/or chalcogenide is preferred. The term "amorphous" as used herein is meant to indicate a material having a broad scattering band which peaks at a 2 θ of from 20° to 40° as determined by X-ray diffractometry using CuKα ray. This material may have a crystalline diffracted ray. The intensity of the strongest crystalline diffracted ray occurring at a 2 θ of from 40° to 70° is preferably 100 times or less, more preferably 5 times or less the intensity of the crystalline diffracted ray at the peak in a broad scattering band occurring at a 2 θ of from 20° to 40°. It is particularly preferred that the amorphous oxide has no crystalline diffracted rays.

In the present invention, an amorphous oxide and/or chalcogenide of semimetal is particularly preferred. It may be selected from the group consisting of oxide and chalcogenide of elements belonging to the groups 13(IIIB) to 15 (VB) in the periodic table, Al, Ga, Si, Sn, Ge, Pb, Sb and Bi, singly or in combination.

Preferred examples of these compounds include $Ga_2O_3$, $SiO$, $GeO$, $SnO$, $SnO_2$, $PbO$, $PbO_2$, $Pb_2O_3$, $Pb_2O_4$, $Pb_3O_4$, $Sb_2O_3$, $Sb_2O_4$, $Sb_2O_5$, $Bi_2O_3$, $Bi_2O_4$, $SnSiO_3$, $GeS$, $SnS$, $SnS_2$, $PbS$, $PbS_2$, $Sb_2S_3$, $Sb_2S_5$, and $SnSiS_3$. These compounds may form a composite oxide with lithium oxide. An example of the composite oxide is $Li_2SnO_2$.

The negative electrode material of the invention is more preferably an amorphous oxide mainly made of Sn, Si or Ge, particularly an amorphous oxide represented by the following general formula (6):

$$SnM^1_d M^2_e O_f \qquad (6)$$

wherein $M^1$ represents at least one element selected from the group consisting of Al, B, P and Ge; $M^2$ represents at least one element selected from the group consisting of elements belonging to the groups 1(IA), 2(IIA) and 3(IIIA) in the periodic table and halogen elements; d represents a number of from 0.2 to 2; e represents a number of from 0.01 to 1, with the proviso that d and e satisfy the relationship 0.2<d+e<2; and f represents a number of from 1 to 6.

Examples of the amorphous oxide mainly made of Sn will be given below, but the present invention should not be construed as being limited thereto.

C-1: $SnSiO_3$
C-2: $Sn_{0.e}Al_{0.2}B_{0.3}P_{0.2}Si_{0.50}O_{3.6}$
C-3: $SnAl_{0.4}B_{0.5}Cs_{0.1}P_{0.5}O_{3.65}$
C-4: $SnAl_{0.4}B_{0.5}Mg_{0.1}P_{0.5}O_{3.7}$
C-5: $SnAl_{0.4}B_{0.4}Ba_{0.08}P_{0.4}O_{3.28}$
C-6: $SnAl_{0.4}B_{0.5}Ba_{0.08}Mg_{0.08}P_{0.30}O_{3.26}$
C-7: $SnAl_{0.1}B_{0.2}Ca_{0.1}P_{0.1}Si_{0.0.50}O_{3.1}$
C-8: $SnAl_{0.2}B_{0.4}Si_{0.4}O_{2.7}$
C-9: $SnAl_{0.2}B_{0.1}Mg_{0.1}P_{0.1}Si_{0.5}O_{2.6}$
C-10: $SnAl_{0.3}B_{0.4}P_{0.2}Si_{0.5}O_{3.55}$
C-11: $SnAl_{0.3}B_{0.4}P_{0.5}Si_{0.5}O_{4.3}$
C-12: $SnAl_{0.1}B_{0.1}P_{0.3}Si_{0.6}O_{3.25}$
C-14: $SnAl_{0.1}B_{0.1}Ca_{0.2}P_{0.1}Si_{0.60}O_{2.95}$
C-15: $SnAl_{0.4}B_{0.2}Mg_{0.1}Si_{0.6}O_{3.2}$
C-16: $SnAl_{0.1}B_{0.3}P_{0.1}Si_{0.5}O_{3.05}$
C-17: $SnB_{0.1}K_{0.5}P_{0.1}SiO_{3.65}$
C-18: $SnB_{0.5}F_{0.1}Mg_{0.1}P_{0.5})_{3.05}$

The amorphous oxide and/or chalcogenide of the invention can be prepared by any of calcining process and solution process, more preferably calcining process. The calcining process preferably comprises thoroughly mixing oxide, chalcogenide or compound of the corresponding elements, and then calcining the mixture to obtain an amorphous oxide and/or chalcogenide.

The calcining temperature is preferably from 500° C. to 1,500° C., and the calcining time is preferably from 1 to 100 hours.

The temperature drop may be accomplished by cooling in the calcining furnace or outside the calcining furnace, e.g., in water. Alternatively, a ultrarapid cooling method such as gun method, Hammer-Anvil method, slap method, gas atomization method, plasma spray method, centrifugal rapid cooling method and melt drag method as described in "Ceramics Processing", Gihodo, 1987, page 217 may be used. Further, a single roller method or twin roller method as described in "New Glass Handbook", Maruzen, 1991, page 172, may be used to cool the material. In the case where a material which melts during calcining is used, the calcined product may be continuously withdrawn while the material is being supplied during calcining. If such a material is used, the melt is preferably stirred.

The calcining gas atmosphere is preferably one having an oxygen content of 5% by volume or less, more preferably an inert gas atmosphere. Examples of the inert gas include nitrogen, argon, helium, krypton, and xenon. The best inert gas is pure argon.

The average particle size of the negative electrode material to be used in the invention is preferably from 0.1 μm to 60 μm. The predetermined particle size can be attained by the use of a well-known grinder or classifier. Examples of such a grinder or classifier employable herein include mortar, ball mill, oscillating ball mill, oscillating mill, satellite ball mill, planetary ball mill, pivoted air flow type jet mill, and sieve. The grinding of the negative electrode material may be accomplished by a wet grinding process involving the presence of water or an organic solvent such as methanol as necessary. In order to attain the desired particle diameter, classification is preferably effected. The classification method is not specifically limited. A sieve, air classifier, etc. may be used as necessary. The classification may be effected in a dry or wet process.

The chemical formula of the compound thus obtained by calcining can be calculated by induction-coupled plasma (ICP) emission spectral analysis as a measuring method or from the difference in mass of powder between before and after calcining as a simple method.

Examples of the negative electrode material which can be used in combination with the amorphous oxide negative electrode material of the invention mainly made of Sn, Si or Ge include carbon material capable of occluding/releasing lithium ion or lithium metal, lithium, lithium alloy, and metal which can be alloyed with lithium.

The electrode compound of the invention may comprise a polymer network containing a structural unit of the general formula (1) already described, a lithium salt and an aprotic organic solvent incorporated therein besides the electrically-conducting agent, binder, filler, etc.

As the electrically-conducting agent there may be used any electronically-conductive material which undergoes no chemical change in the cell. The electrically-conducting agent may normally comprise electrically-conductive materials such as natural graphite (e.g., flake graphite, scaly graphite, soil-like graphite), artificial graphite, carbon black, acetylene black, kechen black, carbon fiber, metal powder (e.g., copper, nickel, aluminum, silver (as described in JP-A-63-148,554)), metallic fiber and polyphenylene derivative (as described in JP-A-59-20,971) incorporated therein, singly or in admixture. The combined use of graphite and acetylene black is particularly preferred. The added amount of these electrically-conducting materials is preferably from 1 to 50% by weight, particularly from 2 to 30% by weight. In particular, the added amount of carbon or graphite is preferably from 2 to 15% by weight.

In the present invention, a binder for retaining the electrode compound is used. Examples of the binder employable herein include polysaccharides, thermoplastic resins, and polymers having rubber elasticity. Preferred examples of the binder include water-soluble polymers such as starch, carboxymethyl cellulose, cellulose, diacetyl cellulose, methyl cellulose, hydroxyethyl cellulose, hydroxypropyl cellulose, sodium alginate, polyacrylic acid, sodium polyacrylate, polyvinyl phenol, polyvinylmethyl ether, polyvinyl alcohol, polyvinyl pyrrolidone, polyacrylonitrile, polyacrylamide, polyhydroxy (meth)acrylate and styrene-maleic acid copolymer, polyvinyl chloride, polytetrafluoroethylene, polyvinylidene fluoride, tetrafluoroethylene-hexafluoropropylene copolymer, vinylidene fluoride-tetrafluoroethylene-hexafluoropropylene copolymer, polyethylene, polypropylene, ethylene-propylene-diene terpolymer (EPDM), sulfonated EPDM, polyvinyl acetal resin, (meth)acrylic acid ester copolymer having (meth)acrylic acid ester such as methyl methacrylate and 2-ethylhexyl acrylate, polyvinyl ester copolymer containing vinylester such as (meth)acrylic acid ester-acrylonitrile copolymer and vinyl acetate, styrene-butadiene copolymer, acrylonitrile-butadiene copolymer, polybutadiene, neoprene rubber, fluororubber, polyethylene oxide, polyester polyurethane resin, polyether polyurethane resin, polycarbonate polyurethane resin, polyester resin, phenolic resin, and epoxy resin, in the form of emulsion (latex) or suspension. Particularly preferred among these binders are polyacrylic acid ester-based latex, carboxymethyl cellulose, polytetrafluoroethylene, and polyvinylidene fluoride.

These binders may be used singly or in admixture. When the added amount of the binder is too small, the retention and agglomeration of the electrode compound are weak. When the added amount of the binder is too great, the volume of the electrode is increased, reducing the unit volume of the electrode or the volume of the electrode per weight. For these reasons, the added amount of the binder is preferably from 1 to 30% by weight, particularly from 2 to 10% by weight.

As the filler there may be used any fibrous material which undergoes no chemical change in the cell. In practice, however, fibers of olefinic polymer such as polypropylene and polyethylene, glass and carbon are used. The added amount of the filler is not specifically limited. In practice, however, it is preferably from 0 to 30% by weight.

The high molecular solid electrolyte of the invention can be used in combination with the separator to secure safety. The separator to be used to secure safety needs to be capable of blocking up the voids in the high molecular solid electrolyte at a temperature of 80° C. or higher, preferably 90° C. to 180° C., to raise the resisitivity of the electrolyte and hence break the flow of current.

The shape of the pores in the separator is normally circle or ellipsoid. The size of the pores is normally from 0.05 $\mu$m to 30 $\mu$m, preferably from 0.1 $\mu$m to 20 $\mu$m. Alternatively, the shape of the pores may be rod-like or irregular as seen in the case where the separator is formed by stretching process or phase separation process. The proportion of these voids, i.e., porosity is from 20% to 90%, preferably from 35% to 80%.

The separator may be singly made of polyethylene, polypropylene or the like or may be made of a composite material of two or more of these materials. In particular, a laminate of two or more microporous films having different pore diameters, porosities and pore blocking temperatures is preferred.

As the positive electrode and negative electrode collector there may be used an electronic conductor which undergoes no chemical change in the cell.

As the positive electrode collector there may be preferably used aluminum, stainless steel, nickel, titanium or aluminum or stainless steel surface-treated with carbon, nickel, titanium or silver. Aluminum or aluminum alloy is particularly preferred.

As the negative electrode collector there may be preferably used copper, stainless steel, nickel or titanium. Copper or copper alloy is particularly preferred.

The collector is normally used in the form of film or sheet. However, the collector may be used in the form of net, punched product, lath, porous material, foamed product, molded product of fibers, etc. The thickness of the collector is not specifically limited. In practice, however, it is from 1 $\mu$m to 500 $\mu$m. The surface of the collector is preferably roughened by surface treatment.

The cell may be sheet-like, rectangular, cylindrical or in any other form. The active positive electrode material and the negative electrode compound are normally applied (coated) to the collector where it is then dried and compressed.

Examples of the coating method to be used herein include reverse roll coating method, direct roll coating method, blade coating method, knife coating method, extrusion coating method, curtain coating method, gravure coating method, bar coating method, dip coating method, and squeeze coating method. Preferred among these coating methods are blade coating method, knife coating method, and extrusion coating method. The coating is preferably effected at a rate of from 0.1 to 100 m/min. The coating method can be properly selected depending on the physical properties and dryability of the solution of the compound to obtain a coat layer having good surface conditions. The coating may be effected successively from one surface to the other or may be simultaneously effected on the both surfaces.

The coating may be effected continuously, intermittently or stripe-wise. The thickness, length and width of the coat layer are predetermined depending on the shape and size of the cell. In practice, however, the thickness of the coat layer on each surface is preferably from 1 $\mu$m to 2,000 $\mu$m in dried and compressed form.

The drying and dehydration of the electrode sheet coat can be accomplished by hot air, vacuum, infrared rays, far infrared rays, electron rays or low humidity air, singly or in combination. The drying temperature is preferably from 80° C. to 350° C., particularly from 100° C. to 250° C. The water content of the entire cell is 2,000 ppm or less. The water content of each of the positive electrode compound, negative electrode compound and electrolyte is preferably 500 ppm or less. The pressing of the sheet can be accomplished by any commonly used method. In particular, calender pressing method is preferred. The pressing pressure is not specifically limited. In practice, however, it is preferably from 0.2 to 3 t/cm$^2$. The pressing rate at calender pressing method is preferably from 0.1 to 50 m/min. The pressing temperature is preferably from room temperature to 200° C. The ratio of width of negative electrode sheet to positive electrode sheet is preferably from 0.9 to 1.1, particularly from 0.95 to 1.0. The ratio of content of negative electrode material to active positive electrode material depends on the kind of the compound or the formulation of the compound.

The rectangular cell is prepared by laminating the positive electrode sheet and the negative electrode sheet with a separator interposed therebetween, working the laminate into a sheet or folding the laminate, inserting the laminate into a rectangular can, electrically connecting the can to the sheet, injecting the electrolyte into the can, and then sealing the can with a sealing plate. The cylindrical cell is prepared by laminating the positive electrode sheet and the negative electrode sheet with a separator interposed therebetween, winding the laminate, inserting the laminate into a cylindrical can, electrically connecting the can to the sheet, injecting the electrolyte into the can, and then sealing the can with a sealing plate. A safety valve can be used as a sealing plate. The cell may be provided with various known safety elements besides safety valve. For example, fuse, bimetal, PTC element, etc. may be used as overcurrent inhibiting element.

As a countermeasure against the rise of inner pressure of the cell can besides safety valve, the cell can may be notched. Alternatively, the gasket may be designed to be cracked. Still alternatively, the sealing plate may be designed to be cracked. Further, the cell may be designed to cut connection with the lead plate. Alternatively, the charger may be provided with or independently connected to a protective circuit having a countermeasure against overcharging or overdischarging.

As a countermeasure against overcharging, the cell may be provided with a system for breaking the flow of current upon the rise of the inner pressure of the cell. In this case, a compound for increasing the inner pressure may be incorporated in the electrode compound or electrolyte. Examples of the compound to be used to increase the inner pressure include carbonates such as $Li_2CO_3$, $LiHCO_3$, $Na_2CO_3$, $NaHCO_3$, $CaCO_3$ and $MgCO_3$.

The cell can and lead plate can be made of an electrically-conductive metal or alloy. Examples of such a metal or alloy employable herein include metal such as iron, nickel, titanium, chromium, molybdenum, copper and aluminum, and alloy thereof.

The welding of the cap, can, sheet and lead plate can be accomplished by any known method (e.g., dc or ac electric welding, laser welding, supersonic welding). As the sealing agent there may be used a compound or mixture which has heretofore been known such as asphalt.

The purpose of the nonaqueous secondary cell of the invention is not specifically limited. Examples of electronic apparatus for which the nonaqueous secondary cell of the invention can be used include note type personal computer, pen-inputted personal computer, mobile personal computer, electronic book player, portable telephone, cordless telephone slave receiver, pager, handy terminal, portable facsimile, portable copying machine, portable printer, headphone stereo, video movie, liquid crystal television, handy cleaner, portable CD, minidisk, electric shaver, transceiver, electronic note, desk electronic calculator, memory card, portable tape recorder, radio, and backup power supply. Examples of consumers' products for which the nonaqueous secondary cell of the invention can be used include automobile, electric vehicle, motor, lighting apparatus, toy, game apparatus, road conditioner, watch, strobe, camera, and medical apparatus (pace maker, hearing aid, massager, etc.). The nonaqueous secondary cell of the invention can also be used for various medical purposes and space purposes. The nonaqueous secondary cell of the invention can also be used in combination with solar cell.

The invention will be described in greater detail with reference to the following Examples, but the invention should not be construed as being limited thereto.

EXAMPLE 1

Synthesis of Compound

Examples of the synthesis of compounds F-1a, F-5a, F-7a, F-16a, F-1b and F-5C of the invention represented by the general formula (I) or (Ia) will be given below.

1. Synthesis of F-1a (Process of Synthesis of F-1a)

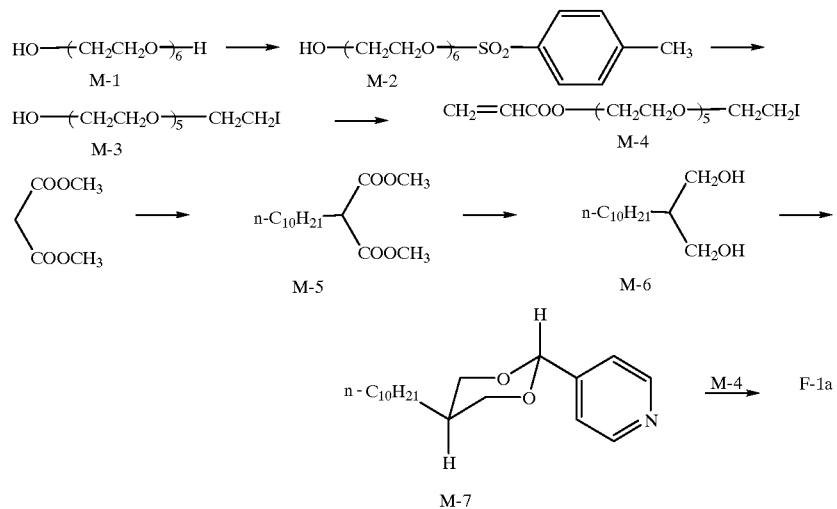

1-1. Synthesis of Intermediate M-2

Hexaethylene glycol (M-1) (50 g, 176 mmol) was dissolved in methylene chloride (400 ml). To the solution thus obtained were then added triethylamine (24.5 ml) and 4-(N, N-dimethylamino)pyridine (0.2 g). To the mixture was then added p-toluenesulfonyl chloride (25.2 g, 132 mmol). The reaction mixture was stirred at a temperature of 30° C. for 10 hours, and then concentrated. To the reaction mixture was then added 500 ml of ethyl acetate. The resulting insoluble matters were removed by filtration. The filtrate was then concentrated. The material thus concentrated was then purified through silica gel column chromatography to obtain M-2 in the form of colorless oily matter (32.2 g).

1-2. Synthesis of Intermediate M-3

M-2 thus obtained (30.4 g, 69.6 mmol) was then dissolved in acetonitrile (500 ml). To the solution thus obtained was then added sodium iodide (31 g). The reaction mixture was then heated under reflux for 2 hours. After cooling, the resulting insoluble matters were removed by filtration. The filtrate was then concentrated. The matter thus concentrated was then purified through silica gel column chromatography to obtain M-3 in the form of light yellow oily matter (21.3 g).

1-3. Synthesis of Intermediate M-4

M-3 thus obtained (log, 32 mmol) was dissolved in tetrahydrofuran (60 ml). To the solution thus obtained was then added triethylamine (5.4 ml). To the reaction mixture was then added dropwise chloride acrylate (2.9 ml, 35.2 mmol) at a temperature of 5° C. in 5 minutes. The reaction mixture was then stirred at room temperature for 5 hours. To the reaction mixture was then added water. The reaction mixture was then extracted with ethyl acetate. The resulting organic phase was dried over magnesium sulfate, concentrated, and then purified through column chromatography to obtain M-4 in the form of light yellow oily matter (6.8 g).

1-4. Synthesis of Intermediate M-5

Dimethyl malonate (58.1 g, 439 mmol) was dissolved in methanol. To the solution thus obtained was then added a 28% methanol solution of sodium methoxide (88 ml). To the reaction mixture was then added dropwise 1-bromodecane (97.2 g, 439 mmol) in 1 hour. The reaction mixture was then heated under reflux for 8 hours. The reaction mixture was then poured into diluted hydrochloric acid so that it was neutralized. The reaction mixture was then extracted with ethyl acetate. The resulting extract was dried over magnesium sulfate, and then concentrated under reduced pressure. The residue was then distilled under reduced pressure to obtain M-5 (41 g, fraction obtained at 3 mmHg/82° C.).

1-5. Synthesis of Intermediate M-6

Lithium aluminum hydride (11 g, 289 mmol) was then dispersed in 150 ml of diethyl ether. To the dispersion thus obtained was then added dropwise a solution of M-5 thus obtained (41 g, 170 mmol) in diethyl ether (50 ml) with stirring at room temperature in 2 hours. After the termination of dropwise addition, the reaction mixture was then heated under reflux. The reaction mixture was then slowly poured into diluted hydrochloric acid/ice so that it was acidified. The reaction solution was then extracted. The resulting extract was then dried over magnesium sulfate. The solvent was then distilled off under reduced pressure to obtain 31 g of a crude product in the form of oily matter. The crude product was then purified through silica gel column chromatography to obtain M-6 in the form of colorless oily matter (14 g).

1-6. Synthesis of Intermediate M-7

M-6 thus obtained (13.85 g, 64 mmol) and pyridine-4-aldehyde (6.86 g, 64 mmol) were dispersed in toluene (50 ml). To the dispersion thus obtained was then added para-toluenesulfonic acid (12 g). The reaction mixture was then heated under reflux while water being distilled off for 5 hours. The reaction mixture was then poured into water (100 ml) having potassium carbonate (10 g) added thereto. The reaction mixture was then extracted with ethyl acetate. The extract was then dried. The solvent was then distilled off under reduced pressure. The residue was then recrystallized from acetonitrile to obtain the desired compound M-7 in the form of crystal (7 g).

1-7. Synthesis of F-1a

M-7 thus obtained (1 g, 3.28 mmol) and M-5 obtained at Section 1-3 (0.61 g, 3.94 mmol) were dispersed in acetonitrile (10 ml). The dispersion thus obtained was then heated under reflux for 8 hours. The resulting crystal was collected, and then recrystallized from ethyl acetate to obtain the desired compound F-1a (1.4 g). The structure of the compound F-1a was confirmed by $^1$H-NMR spectrum.

2. Synthesis of F-5a (Process of Synthesis of F-5a)

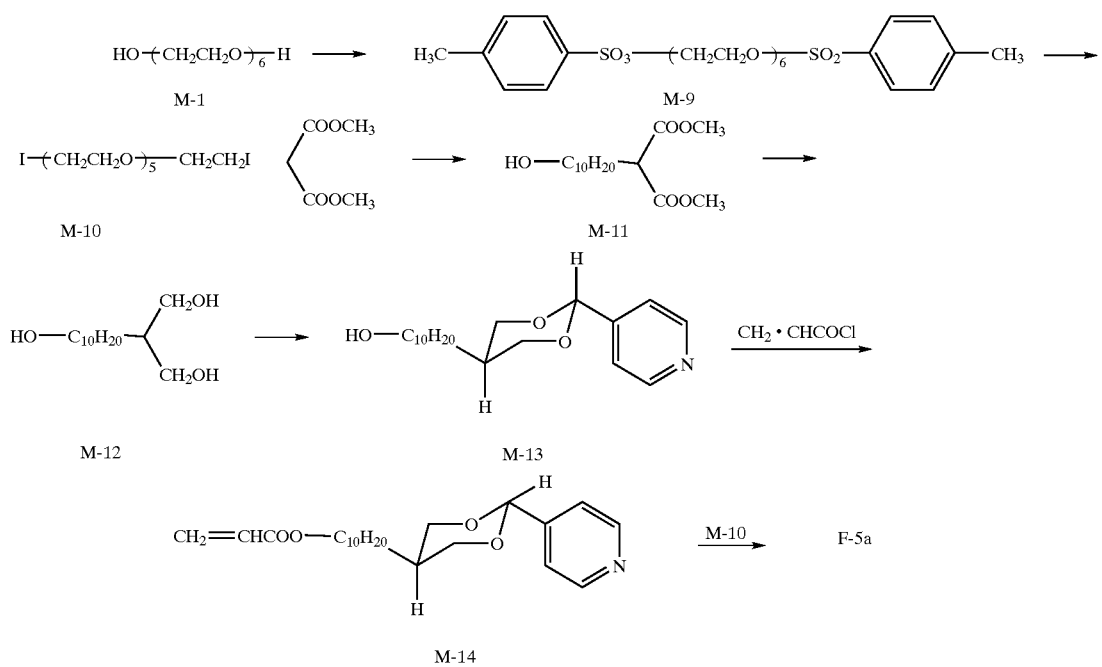

2-1. Synthesis of Intermediate M-9

Hexamethylene glycol (M-1) (50 g, 176 mmol) was dissolved in methylene chloride (1,000 ml). To the solution thus obtained were then added triethylamine (54 ml) and 4-(N,N-dimethylamino)pyridine (0.3 g). To the reaction mixture was then added p-toluenesulfonyl chloride (70.5 g, 370 mmol). The reaction mixture was stirred at a temperature of 30° C. for 5 hours, and then concentrated. To the reaction mixture thus concentrated was then added 500 ml of ethyl acetate. The resulting insoluble matters were then removed by filtration. The filtrate was concentrated, and then purified through silica gel column chromatography to obtain M-9 in the form of colorless oily material (56 g).

2-2. Synthesis of Intermediate M-10

M-9 thus obtained (40 g, 67.7 mmol) was then dissolved in acetonitrile (400 ml). To the solution thus obtained was then added sodium iodide (30 g). The reaction mixture was then heated under reflux for 2 hours. After cooling, the resulting insoluble matters were removed by filtration. The filtrate was then concentrated. The matter thus concentrated was then purified through silica gel column chromatography to obtain M-10 in the form of light yellow oily matter (21 g).

2-3. Synthesis of Intermediate M-11

Dimethyl malonate (29 g, 219 mmol) was dissolved in methanol. To the solution thus obtained was then added a 28% methanol solution of sodium methoxide (44 ml). To the reaction mixture was then added dropwise 10-bromodecanol (26 g, 110 mmol) in 1 hour. The reaction mixture was then heated under reflux for 8 hours. The reaction mixture was then poured into diluted hydrochloric acid so that it was neutralized. The reaction mixture was then extracted with ethyl acetate. The resulting extract was dried over magnesium sulfate, and then concentrated under reduced pressure. The residue was then distilled under reduced pressure to obtain M-11 in the form of colorless crystal (11 g).

2-4. Synthesis of Intermediate M-12

M-11 thus obtained (10 g, 34.6 mmol) was dissolved in t-butanol (60 ml). To the solution thus obtained was then added $NaBH_4$ (10.2 g). To the reaction mixture was then added dropwise gradually methanol (8 ml) under reflux in 30 minutes. After the termination of dropwise addition, the reaction mixture was then heated under reflux for 30 minutes. After cooling, the reaction mixture was then poured into ice water. The reaction mixture was then acidified with concentrated hydrochloric acid. The resulting white solid was withdrawn by filtration to obtain M-12 (6.7 g).

2-5. Synthesis of Intermediate M-13

M-12 thus obtained (6.21 g, 26.7 mmol) and pyridine-4-aldehyde (3 g, 28 mmol) were dispersed in toluene (50 ml). To the dispersion thus obtained was then added paratoluenesulfonic acid (5 g). The reaction mixture was then heated under reflux while water being distilled off for 4 hours. The reaction mixture was then poured into water (100 ml) having potassium carbonate (10 g) added thereto. The reaction mixture was then extracted with ethyl acetate. Toluene was then distilled off. The resulting crystal was withdrawn by filtration, and then recrystallized from acetonitrile to obtain the desired compound M-13 in the form of crystal (2.1 g).

2-6. Synthesis of Intermediate M-14

M-13 thus obtained (1 g, 3.1 mmol) was dissolved in tetrahydrofuran. To the solution thus obtained was then added 0.45 ml of triethylamine. To the reaction mixture was then added dropwise chloride acrylate (0.28 g, 3.1 mmol) at an inner temperature of 0° C. The reaction mixture was then stirred at a temperature of 0° C. for 1 hour. The reaction solution was then poured into water. The reaction mixture was then extracted with ethyl acetate. The extract was dried over magnesium sulfate, dried, and then concentrated. The material thus concentrated was purified through silica gel column chromatography, and then recrystallized from acetonitrile to obtain M-14(0.7 g).

2-7. Synthesis of F-5a

M-14 thus obtained (0.7 g, 1.85 mmol) and M-10 (0.39 g, 0.775 mmol) were dissolved in acetonitrile. The solution thus obtained was then heated under reflux for 5 hours. The reaction solution was concentrated, and then purified through silica gel column chromatography to obtain F-5a in the form of light yellow oily matter (0.8 g). The structure of F-5a was confirmed by NMR.

3. Synthesis of F-7a
(Process of Synthesis of F-7a)

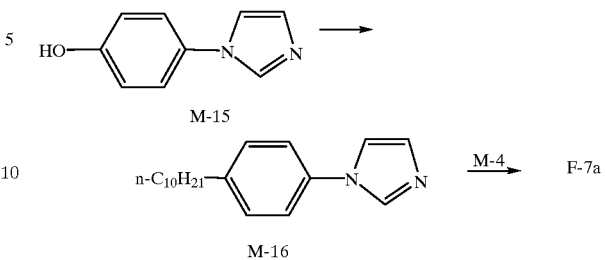

3-1. Synthesis of Intermediate M-16

N-(4-hydroxyphenyl)imidazole (M-15) (4.8 g, 30 mmol) was dissolved in THF (30 ml). To the solution thus obtained was then added hydrogenated sodium (60% in oil, 1.32 g, 33 mmol) at an inner temperature of 5° C. To the reaction mixture was then added dropwise 1-bromodecane (6.63 g, 30 mol). The reaction mixture was then stirred at room temperature for 1 hour. The reaction solution was then poured into water. The reaction solution was then extracted with ethyl acetate. The extract (organic phase) was dried over magnesium sulfate, and then concentrated. The material thus concentrated was then crystallized from acetonitrile to obtain M-16 in the form of crystal (6.1 g).

3-2. Synthesis of F-7a

M-16 thus obtained (0.673 g, 2.24 mmol) and M-4 obtained at Section 1-3 (1.0 g, 2.24 mmol) were dissolved in acetonitrile. The solution thus obtained was then heated under reflux for 6 hours. After the termination of reaction, the reaction solution was concentrated, and then purified through silica gel column chromatography to obtain the desired compound F-7a in the form of light yellow oily material (0.93 g).

4. Synthesis of F-16a
(Process of Synthesis of F-16a)

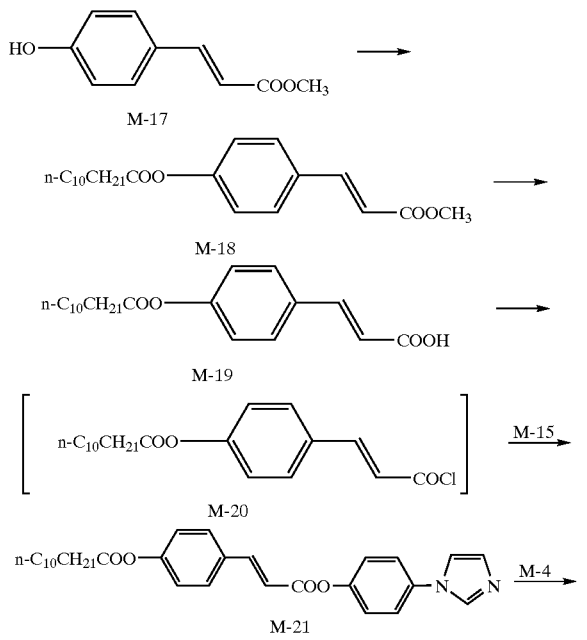

4-1. Synthesis of Intermediate M-18

Methyl ester 4-hydroxycinnomate (M-17) (5.0 g, 28 mmol) was dissolved in DMF. To the solution thus obtained was then added potassium carbonate (7.8 g). To the reaction mixture was then added dropwise 1-bromodecane (6.5 g, 29 mmol) at an inner temperature of 80° C. The reaction mixture was then stirred at a temperature of 80° C. for 1 hour. To the reaction solution were then added water and ethyl acetate so that it was extracted. The extract (organic phase) was dried over magnesium sulfate, and then concentrated. The material thus concentrated was then crystallized from acetonitrile to obtain M-18 in the form of crystal (8.2 g).

4-2. Synthesis of Intermediate M-19

M-18 thus obtained (8.1 g, 25.4 mmol) was dispersed in methanol (100 ml). To the dispersion was then added a solution of KOH (2.85 g, 50.8 mmol) in water (10 ml). The reaction mixture was then heated under reflux for 2 hours. The reaction solution was then allowed to cool to room temperature. To the reaction product was then added water (100 ml). The reaction product was then acidified with concentrated hydrochloric acid. The resulting crystal was withdrawn by filtration, washed with water, and then dried to obtain M-19 (6.9 g).

4-3. Synthesis of Intermediate M-21

M-19 thus obtained (1.0 g, 3.28 mmol) was dissolved in acetonitrile (10 ml)/dimethylacetamide (5 ml). To the solution thus obtained was then added thionyl chloride (0.26 ml) at room temperature. The reaction mixture was then stirred for 30 minutes. To the reaction mixture was then added M-15 (0.525 g, 3.28 mmol). To the reaction mixture was then added 1 ml of triethylamine. The reaction mixture was then stirred for 5 hours. To the reaction mixture was then added a solution of $K_2CO_3$ in water (20 ml) so that it was rendered basic. The resulting solid matter was withdrawn by filtration, and then dissolved in ethyl acetate. The resulting insoluble matters were then removed by filtration under heating. The filtrate was then concentrated. The material thus concentrated was then crystallized from acetonitrile to obtain M-21 in the form of crystal (0.8 g).

4-4. Synthesis of F-16a

M-21 thus obtained (0.7 g, 1.57 mmol) and M-4 obtained at Section 1-3 (0.7 g, 1.57 mmol) were dispersed in acetonitrile. The dispersion thus obtained was then heated under reflux for 8 hours. The reaction solution was then allowed to cool to room temperature. The resulting crystal (unreacted M-21) was removed by filtration. The filtrate was then concentrated. The material thus concentrated was then purified through silica gel column chromatography to obtain F-16a (0.9 g). The structure of the compound F-16a was confirmed by $^1$H-NMR spectrum.

5. Synthesis of F-1b

F1a obtained at Section 1 (0.4 g, 0.534 mmol) was dissolved in a solution of methylene chloride (10 ml) in water (10 ml). To the solution thus obtained was then added $LiN(SO_2CF_3)_2$ (0.137 g, 0.543 mmol). The reaction mixture was then stirred. The resulting methylene chloride phase was separated, concentrated, and then purified through silica gel column chromatography to obtain F-1b in the form of colorless oily matter (0.32 g).

6. Synthesis of F-5c

F-5a obtained at Section 2 (0.47 g, 0.375 mmol) was dissolved in water (10 ml). To the solution thus obtained was then added $AgBF_4$ (0.22 g, 1.13 mmol). The reaction mixture was then stirred for 30 minutes. The resulting insoluble matters were removed by filtration. Water in the filtrate was then distilled off. The residue was then purified through silica gel column chromatography to obtain F-5c in the form of colorless oily material (0.3 g).

EXAMPLE 2

Photoelectrochemical Cell 2-1. Preparation of Titanium Dioxide Dispersion

In a stainless steel vessel having an inner capacity of 200 ml coated with teflon on the inner side thereof were charged 15 g of titanium dioxide (Degussa P-25, produced by Nippon Aerosil Co., Ltd.), 45 g of water, 1 g of a dispersant (Triton X-100, produced by Aldrich Co., Ltd.), and 30 g of zirconia beads having a diameter of 0.5 mm. The mixture was subjected to dispersion at 1,500 rpm by means of a sand grinder mill (produced by Aimex Co., Ltd.) for 2 hours. The zirconia beads were then removed from the dispersion by filtration. At this point, titanium dioxide had an average particle diameter of 2.5 μm. For the measurement of particle diameter, a master sizer produced by MALVERN INC. was used.

2-2. Preparation of Dye-Adsorbed $TiO_2$ Electrode (Electrode A)

An electrically-conductive glass coated with tin oxide doped with fluorine (obtained by cutting TCO glass-U produced by Asahi Glass Co., Ltd. into a size of 20 mm×20 mm) was coated with the foregoing dispersion by means of a glass rod on the electrically-conductive surface thereof. Before coating, an adhesive tape was applied to the electrically-conductive surface of the electrically-conductive glass on an area (3 mm from the end thereof) to form a spacer. These glass sheets were then arranged with the adhesive tape disposed at the both ends thereof. Eight glass sheets were coated at once. The adhesive tape was then peeled off. The glass sheets were each air-dried for 1 day. Subsequently, these glass sheets were each calcined at a temperature of 450 C. in an electric furnace (Type FP-32 muffle furnace, produced by Yamato Scientific Co., Ltd.) for 30 minutes. The glass sheets were each withdrawn from the furnace, cooled, and then dipped in an ethanol solution of dye R-1 ($3\times10^{-4}$ mol/l). The glass sheets thus dyed were each dipped in 4-tert-butylpyridine for 15 minutes, washed with ethanol, and then naturally dried. The thickness of the photosensitive layer thus obtained was 10 μm. The coated amount of the particulate semiconductor was 20 g/m². The surface resistivity of the electrically-conductive glass was about 30 Ω/square.

2-3. Preparation of Photoelectrochemical Cell

The dye-sensitized $TiO_2$ electrode substrate (1 cm×1 cm) thus prepared was then coated with an acetonitrile solution of compositions containing the compounds of the invention set forth in Table 1 and comparative compounds (RE-1), (RE-2) and (RE-3)(amount of acetonitrile was the same as that of the composition), respectively. Acetonitrile was then distilled off at a temperature of 60° C. under reduced pressure while the $TiO_2$ electrode was being impregnated with the acetonitrile solution. Polymerization was then allowed to undergo with an electrolyte under the conditions set forth in Table 1. These electrodes were each laminated with a platinum-deposited glass having the same size as that of the electrode to obtain photoelectrochemical cells (Samples 102 to 111) (Table 1, FIG. 1). The electrolyte comprising a solvent (A set forth in Table 1) was allowed to penetrate into the gap between the two sheets of glass in the laminate of the foregoing dye-sensitized $TiO_2$ electrode substrate (2 cm×2 cm) and a platinum-deposited glass having the same size as that of the electrode by capillarity to prepare a photoelectrochemical cell (Sample 101).

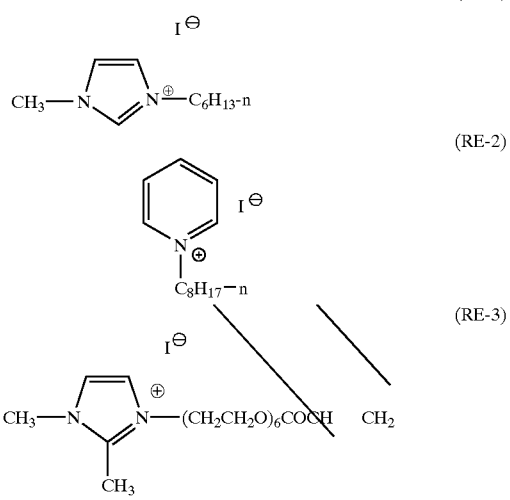

In accordance with the present example, a photoelectrochemical cell comprising an electrically-conductive glass (glass 1 having an electrically-conducting agent layer 2 provided thereon), a $TiO_2$ electrode 3, a dye layer 4, an electrolyte 4, an electrolyte 5, a platinum layer 6 and a glass layer 7 laminated on each other in this order was prepared.

TABLE 1

Composition and polymerization conditions of electrolyte

| Electrolyte | Composition (wt-%) | Treatment | Sample | Remarks |
|---|---|---|---|---|
| A | $(C_4H_9)_4N^+I^-(48)$/ BCE(50)/$I_2(2)$ | None | (101) | Comparative |
| B | RE-1(98)/$I_2$(2) | None | (102) | Comparative |
| C | RE-2(98)/$I_2$(2) | None | (103) | Comparative |
| D | RE-3(95)/$I_2$(2)/ DMAIB(3) | 80° C. heating- 1 hr. | (104) | Comparative |
| E | RE-3(94)/$I_2$(2)/ Irg907 (2)/DET (1) | 5° C.-UV irradiation-20 min. | (105) | Comparative |
| F | F-1a(95)/$I_2$(2)/ DMAIB(3) | 80° C. heating - 1 hr. | (106) | Present Invention |
| G | F-1a(94)/$I_2$(2)/ Irg907(2)/DET (1) | 5° C.-UV irradiation-20 min. | (107) | Present Invention |
| H | F-5a(95)/$I_2$(2)/ DMAIB(3) | 80° C. heating - 1 hr. | (108) | Present Invention |
| I | F-7a(95)/$I_2$(2)/ DMAIB(3) | 80° C. heating - 1 hr. | (109) | Present Invention |
| J | F-12a(95)/$I_2$ (2)/DMAIB(3) | 80° C. heating - 1 hr. | (110) | Present Invention |
| K | F-16a(95)/$I_2$ (2)/DMAIB(3) | 80° C.C heating - 1 hr. | (111) | Present Invention |

BCE (solvent) Biscyanoethyl ether
DMAIB (heat polymerization initiator) Dimethyl-2,2'-azobisisobutyrate
Irg907 (photopolymerization initiator) Irgacure 907 (Ciba Geigy Inc.)
DET (sensitizer) Diethyl thioxanathone 2-4. Measurement of Photoelectric Conversion Efficiency Light from a 500 W xenon lamp (produced by USHIO INC.) was allowed to pass through an AM 1.5 filter (produced by Oriel Co., Ltd.) and a sharp cut filter (Kentol-41) to produce imitation sunlight free of ultraviolet rays. The intensity of this light beam was then adjusted to 40 mW/cm².

The foregoing photoelectrochemical cell was then irradiated with the imitation sunlight with an alligator clip connected to the electrically-conductive glass and the platinum deposited glass, respectively. The resulting electricity was then measured by an ammeter-voltmeter (KEITHLEY Type SMU238). The open voltage (Voc), shortcircuited current density (Jsc), fill factor (FF) (=maximum output/(open voltage×shortcircuited current)), conversion efficiency (η) and drop of shortcircuited current density after 600 hours of continuous irradiation thus determined are collectively set forth in Table 2.

TABLE 2

Photoelectric conversion properties

| Sample | Jsc (mA/cm²) | Voc (V) | FF | η | % Drop of JSC after 600 hr. | Remarks |
|---|---|---|---|---|---|---|
| (101) | 2.6 | 0.44 | 0.65 | 1.7 | 94 | Comparative |
| (102) | 2.7 | 0.42 | 0.55 | 1.6 | 33 | Comparative |
| (103) | 2.6 | 0.39 | 0.56 | 1.4 | 39 | Comparative |
| (104) | 1.9 | 0.52 | 0.42 | 0.49 | 18 | Comparative |
| (105) | 1.8 | 0.53 | 0.43 | 1.0 | 21 | Comparative |
| (106) | 3.5 | 0.55 | 0.50 | 2.4 | 10 | Present invention |
| (107) | 3.9 | 0.56 | 0.55 | 3.0 | 8 | Present invention |
| (108) | 3.4 | 0.53 | 0.59 | 2.6 | 9 | Present invention |
| (109) | 3.3 | 0.51 | 0.58 | 2.4 | 11 | Present invention |
| (110) | 3.1 | 0.54 | 0.56 | 2.3 | 12 | Present invention |
| (111) | 3.2 | 0.49 | 0.54 | 2.1 | 14 | Present invention |

*Jsc: Shortcircuited current, Voc: Open voltage, FF: Fill factor, η: Conversion efficiency The photoelectrochemical cell comprising a comparative electrolyte made of a solvent (101) exhibits poor initial properties and a very poor durability due to the evaporation of the solvent. The photoelectrochemical cells (102, 103, 104, 105) comprising electrolytes made of comparative compounds RE-1, RE-2 and RE-3, respectively, exhibit a relatively improved durability but poor initial properties. On the contrary, the photoelectrochemical cells comprising the compounds of the invention are excellent all in shortcircuited current density, initial conversion efficiency and other properties, and durability. This effect can be exerted with any of the dyes used.

EXAMPLE 3

Measurement of Ionic Conductivity 3-1. Electrolyte Obtained by Heat Polymerization of Ionic Monomer F-1a To the ionic liquid crystal monomer F-1a of the invention (50 mg) was added 1 ml of a solution of 89 mg of LiI in 10 ml of acetonitrile. Acetonitrile was then distilled off under reduced pressure. To the reaction mixture was then added 1 ml of a solution of 31 mg of DMAIB in 20 ml of methylene chloride. Methylene chloride was then distilled off. The reaction mixture was then heated to a temperature of 100° C. under reduced pressure for 2 hours to undergo heat polymerization. The resulting polymer electrolyte was then provided interposed between two sheets of ITO glass electrodes with a 100 μm thick teflon tape provided as a spacer interposed therebetween. The electrode laminate was heated to a temperature of 80° C., and then cooled to a temperature of 5° C. in 6 hours. The electrode laminate was then kept at the same temperature for 1 hour. The electrolyte was then measured for ionic conductivity. The electrolyte was then measured for ionic conductivity at various temperatures up to 80° C. The results are set forth in Table 3 (column A).

3-2. Electrolyte Obtained by Heat Polymerization of Ionic Monomer F-7a

The electrolyte was then measured for ionic conductivity at temperatures of from 0° C. to 80° C. in the same manner as in Section 3-1. The results are set forth in Table 3 (column B).

3-3. Ionic Conductivity of Electrolyte Obtained by Photopolymerization of Ionic Monomer F-1a To F-1a (50 ml) was added 1 ml of a solution of 89 mg of LiI in 10 ml of acetonitrile. To the solution thus obtained were then added Irg907 (20 mg), DET (10 mg) and 1 ml of a solution of Biscoat #335HP (crosslinking agent produced by OSAKA ORGANIC CHEMICAL INDUSTRY LTD.)(50 mg) in methylene chloride (20 ml).

Acetonitrile and methylene chloride were then distilled off under reduced pressure. The resulting monomer mixture was then provided interposed between two sheets of ITO glass electrodes with a 100 µm thick teflon tape provided as a spacer interposed therebetween. The electrode laminate was heated to a temperature of 80° C., and then cooled to a temperature of 0° C. in 6 hours. The electrode laminate was then kept at the same temperature for 3 hours. The monomer mixture was then irradiated with UV rays through the ITO transparent electrode at a temperature of 0° C. for 20 minutes to undergo photopolymerization. The resulting electrolyte was then measured for ionic conductivity at various temperatures between 0° C. and 80° C. The results are set forth in Table 3 (column C).

3-4. Ionic Conductivity of Comparative Monomer RE-1:

RE-3 (50 mg), LiI (8.9 mg) and DMAIB (3 mg) were dissolved in 20 ml of acetonitrile. Acetonitrile was then distilled off under reduced pressure. The resulting monomer mixture was then heated to a temperature of 80° C. under reduced pressure for 3 hours to undergo heat polymerization. The resulting polymer electrolyte was then measured for ionic conductivity in the same manner as in Section 3-1. The results are set forth in Table 3 (column D).

TABLE 3

| | Ionic conductivity (S/cm) | | | |
|---|---|---|---|---|
| Temperature of measurement (° C.) | A (Example 3-1) Present invention | B (Example 3-2) Present invention | C (Example 3-3) Present invention | D (Example 3-4) Comparative |
| 0 | Not measured | 6.18E$^{-4}$ | 6.93E$^{-4}$ | 7.80E$^{-7}$ |
| 5 | 8.58E$^{-4}$ | 6.79E$^{-4}$ | Not measured | Not measured |
| 10 | 1.128E$^{-3}$ | 7.54E$^{-4}$ | 8.58E$^{-4}$ | 3.20E$^{-6}$ |
| 20 | 1.60E$^{-3}$ | 8.50E$^{-4}$ | 9.53E$^{-4}$ | 9.00E$^{-6}$ |
| 30 | 2.70E$^{-3}$ | 7.45E$^{-4}$ | 8.89E$^{-4}$ | 2.09E$^{-3}$ |
| 40 | 2.27E$^{-3}$ | 8.65E$^{-6}$ | 7.03E$^{-4}$ | 4.18E$^{-6}$ |
| 50 | 6.55E$^{-4}$ | 4.21E$^{-5}$ | 6.28E$^{-4}$ | 7.49E$^{-5}$ |
| 60 | 1.78E$^{-4}$ | 4.89E$^{-5}$ | 7.32E$^{-4}$ | 1.31E$^{-4}$ |
| 70 | 1.32E$^{-4}$ | 8.73E$^{-5}$ | 8.13E$^{-4}$ | 2.39E$^{-4}$ |
| 80 | 1.62E$^{-4}$ | 1.44E$^{-4}$ | 8.67E$^{-4}$ | 3.40E$^{-4}$ |

3-5. Results of Measurement of Ionic Conductivity

As can be seen in Column A and B of Table 3, the polymer electrolyte obtained by the polymerization of the ionic liquid crystal monomer of the invention exhibited an extremely high ionic conductivity particularly at low temperatures as compared with the polymerization product of RE-3 having no liquid crystallinity (column D of Table 3). The electrolyte obtained by heat polymerization exhibited a drop of ionic conductivity at temperatures of not lower than 30° C. or 40° C. As can be seen in Column C of Table 3, the electrolyte obtained by photopolymerization at low temperature (Example 3-3) exhibited a suppressed drop of ionic conductivity at high temperatures (60° C. to 80° C.).

In accordance with the present invention, an electrolyte which doesn't substantially volatilize and exhibits excellent charge-transporting properties can be obtained, making it possible to obtain a photoelectrochemical cell having excellent photoelectric conversion properties and less deterioration of properties with time. Further, a lithium ion-conducting material having an extremely high ionic conductivity at low temperatures can be obtained.

While the invention has been described in detail and with reference to specific examples thereof, it will be apparent to one skilled in the art that various changes and modifications can be made therein without departing from the spirit and scope thereof.

What is claimed is:

1. An electrolyte composition comprising a polymer compound formed by polymerizing an ionic liquid crystal monomer containing at least one polymerizable group, and at least one divalent cyclic substituent and at least one substituted or unsubstituted alkyl or alkenyl group.

2. The electrolyte composition according to claim 1, wherein the ionic liquid crystal monomer has an organic cation-containing mesogen group and an ethyleneoxy group.

3. The electrolyte composition according to claim 1, wherein the ionic liquid crystal monomer is represented by the following general formula (I):

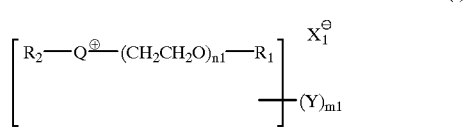

(I)

wherein Q represents an organic atomic group which can form a cation; $R_1$ represents an alkyl or alkenyl group; $R_2$ represents substituent which imparts liquid crystallinity; $X_1^-$ represents an anion; Y represents a polymerizable group which substitutes on $R_1$, $R_2$ or Q; $n_1$ represents an integer of from 1 to 25; $m_1$ represents an integer of from 1 to 4, with the proviso that when m1 is 2 or more, the plurality of Y's may be the same or different and that the compound of the general formula (I) may be connected to each other at $R_1$ or $R_2$ to form a dimer, trimer or tetramer.

4. The electrolyte composition according to claim 3, wherein $R_2$ in the general formula is represented by the following general formula (II):

(II)

wherein $R_3$ represents an alkyl or alkenyl group; $Y_2$ represents a divalent 4-, 5-, 6- or 7-membered ring substituent or a condensed ring substituent formed thereby; $Q_1$ and $Q_2$ each represent a divalent substituent or a single bond; and $n_2$ represents an integer of from 1 to 3, with the proviso that when $n_2$ is 2 or 3, the plurality of $Y_2$'s, $Q_1$'s and $Q_2$'s may be the same or different, respectively.

5. The electrolyte composition according to claim 3, wherein Y in the general formula (I) is represented by the following general formula (III):

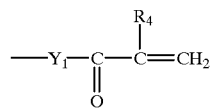
(III)

wherein $R_4$ represents a hydrogen atom or an alkyl group; $—Y_1—$ represents $—O—$, $—N(R_7)—$ or a single bond; and $R_7$ represents a hydrogen atom or alkyl group, with the proviso that when $m_1$ in the general formula is 2 or more, $R_4$ in the plurality of Y's may be the same or different.

6. The electrolyte composition according to claim 3, wherein Q in the general formula (I) is an organic atomic group which can form a heterocyclic cation containing a nitrogen atom or a quaternary alkylammonium cation.

7. The electrolyte composition according to claim 3, wherein —Q— in the general formula (I) is represented by the following general formula (IV):

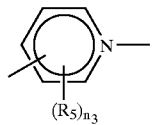
(IV)

wherein $R_5$ represents a substituent; and $n_3$ represents an integer of from 0 to 4, with the proviso that when $n_3$ is 2 or more, the plurality of $R_5$'s may be the same or different.

8. The electrolyte composition according to claim 3, wherein —Q— in the general formula (I) is represented by the following general formula (V):

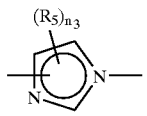
(V)

wherein $R_5$ represents a substituent; and $n_3$ represents an integer of from 0 to 3, with the proviso that when $n_3$ is 2 or more, the plurality of $R_5$'s may be the same or different.

9. The electrolyte composition according to claim 3, wherein $X_1^-$ in the general formula (I) is a halogen anion, an amide anion, or a fluoride anion containing at least one element selected from the group consisting of boron (B), phosphorus (P) and sulfur (S).

10. The electrolyte composition according to claim 3, wherein $X_1^-$ in the general formula (I) is an iodine anion.

11. The electrolyte composition according to claim 1, wherein the polymerizable group is an ethylenically unsaturated group.

12. The electrolyte composition according to claim 1, wherein the polymerizable group comprises a group selected from the group consisting of acryloyl group, methacryloyl group and styryl group.

13. The electrolyte composition according to claim 1, further comprising a lithium salt.

14. The electrolyte composition according to claim 1, comprising a polymer compound obtained by photopolymerizing the ionic liquid crystal monomer while being oriented.

15. An electrochemical cell comprising an electrolyte composition according to claim 1.

16. A nonaqueous secondary cell comprising an electrolyte composition according to claim 1.

* * * * *